United States Patent
Cammack et al.

(10) Patent No.: US 11,536,090 B2
(45) Date of Patent: Dec. 27, 2022

(54) VOLTAGE LINE COMMUNICATIONS DURING PULSE POWER DRILLING

(71) Applicant: Halliburton Energy Services, Inc., Houston, TX (US)

(72) Inventors: Matthew Eugene Cammack, Houston, TX (US); Boguslaw Wiecek, Kingwood, TX (US)

(73) Assignee: Halliburton Energy Services, Inc., Houston, TX (US)

( * ) Notice: Subject to any disclaimer, the term of this patent is extended or adjusted under 35 U.S.C. 154(b) by 113 days.

(21) Appl. No.: 17/123,911

(22) Filed: Dec. 16, 2020

(65) Prior Publication Data
US 2022/0186564 A1 Jun. 16, 2022

(51) Int. Cl.
*E21B 7/15* (2006.01)
*G01R 19/165* (2006.01)
*E21B 47/00* (2012.01)

(52) U.S. Cl.
CPC ............ *E21B 7/15* (2013.01); *E21B 47/00* (2013.01); *G01R 19/16533* (2013.01)

(58) Field of Classification Search
CPC ... E21B 7/15; E21B 7/24; E21B 47/00; G01R 19/16533
See application file for complete search history.

(56) References Cited

U.S. PATENT DOCUMENTS

| 2015/0083491 | A1* | 3/2015 | Moeny | H03H 7/38 |
| | | | | 307/112 |
| 2016/0369622 | A1 | 12/2016 | Wheeler et al. | |
| 2018/0148981 | A1* | 5/2018 | Moeny | E21B 17/003 |
| 2020/0217140 | A1* | 7/2020 | Liu | E21B 7/15 |

FOREIGN PATENT DOCUMENTS

| EP | 2620585 A1 | 7/2013 |
| EP | 3508683 B1 | 11/2020 |
| WO | 9520097 A1 | 7/1995 |

OTHER PUBLICATIONS

PCT Application No. PCT/US2021/053747, International Search Report, dated Jan. 28, 2022, 6 pages.
PCT Application No. PCT/US2021/053747, Written Opinion, dated Jan. 28, 2022, 3 pages.

* cited by examiner

*Primary Examiner* — David Carroll
(74) *Attorney, Agent, or Firm* — Delizio, Peacock, Lewin & Guerra

(57) ABSTRACT

A method of communication along a shared voltage line is disclosed. In pulse power drilling, a generator charges applies voltage to a shared voltage line, which capacitively charges electrodes for formation drilling. While the generator controls the charging rate, charge voltage, and post-delay time between the charging cycles, a pulse power controller determines the pre-delay time by firing electrodes to discharge the stored voltage. Communication from the pulse power controller to the generator is encoded in the pre-delay time, where pre-delay times longer than a minimum pre-delay time correspond to time bins with pre-determined communications between the pulse power controller and the generator. The generator can also communicate to the pulse power controller via manipulation of the post-delay time.

20 Claims, 9 Drawing Sheets

VOLTAGE LINE COMMUNICATIONS DURING PULSE POWER DRILLING

TECHNICAL FIELD

The disclosure generally relates to pulse power drilling, and to voltage line communications during pulse power drilling.

BACKGROUND

During pulse power drilling, communication among different components of a drill string can be inhibited by the electrical power that is generated and transmitted along the drill string. Such power levels can result in fluctuations in electric fields and mechanical oscillations. Also, pulse power drilling operations can cause vibrations that further complicate electrical, mechanical, and optical signal transmission between components downhole. Drill string components for pulse power drilling can also experience stress at joints and junctions between components, which can weaken communication and mechanical links between portions of the drill string.

BRIEF DESCRIPTION OF THE DRAWINGS

Aspects of the disclosure may be better understood by referencing the accompanying drawings.

DESCRIPTION

Figure 1:
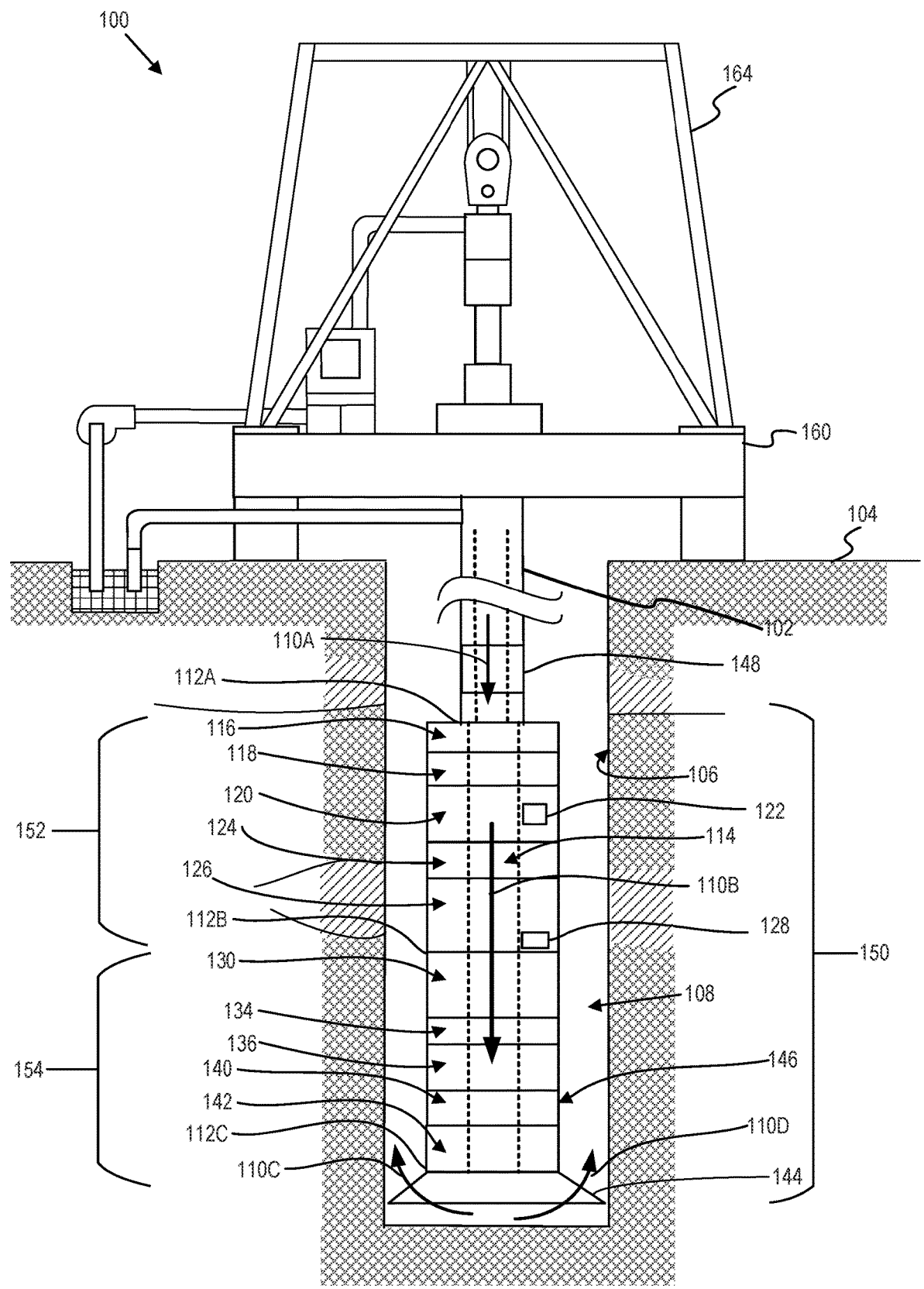
FIG. 1 depicts an example pulse power drilling assembly, according to some embodiments.

The description that follows includes example systems, methods, techniques, and program flows that embody aspects of the disclosure. However, it is understood that this disclosure may be practiced without these specific details. For instance, this disclosure refers to communication between a generator and a pulse power controller in illustrative examples. Aspects of this disclosure can be also applied to communication between a voltage supplier and a discharge controller that on a shared voltage line. In other instances, well-known instruction instances, protocols, structures, and techniques have not been shown in detail in order not to obfuscate the description.

In pulse power drilling, drilling can be based on periodic electrical discharges from electrodes that cause formation destruction due to plasma formation, liquid vaporization, gas expansion due to temperature changes, vibration, and shockwave effects, etc. In various cases, the rate and timing of charging and discharging can be adjusted due to changes in drilling or formation conditions. For example, a rate of the charging of capacitors in a next charge cycle can be increased if the bottom of the drilling assembly is not in contact with a bottom of the borehole.

In some embodiments, various components of the pulse power drilling assembly can communicate through a voltage line for transmission of power between components of the drilling assembly (instead of a conventional communication line).

In some implementations, the components communicating to each other via a voltage line can include two different controllers (or computing devices) at different longitudinal locations along the drilling assembly. For example, a first controller can be a generator controller for controlling a generator that generates the power to be used to create the periodic electrical discharges. A second controller can be a pulse power controller for controlling the periodic emitting of the electric discharges into the subsurface formation through one or more electrodes. In some implementations, the pulse power controller can encode a communication (regarding the charge time or rate of the next charge cycle) in the voltage line that is received and decoded by the generator controller. For example, the pulse power controller can encode the communication by varying a time delay between a time when the capacitors are considered fully charged and a time when the electrical discharge occurs or a length of time over which the voltage is substantially constant. As further described below, communication can be bidirectional between the components. For instance, the pulse power controller and the generator controller can communicate by adjusting or modulating different time lengths and voltages along the shared voltage line. Additionally, different encoding techniques can be used for encoding communications on the voltage line.

For example, communications can be encoded in a length of the pre-delay prior to electrode discharge, the length of a post delay prior to the beginning of a next charge cycle, voltage fluctuations during pre-delay, voltage fluctuations during post-delay, voltage levels, etc. Because communications can leverage an existing voltage line, an additional line or source of communication is not needed between certain components of the drilling assembly. Such embodiments can be used across a joint of the drilling assembly where two parts of the assembly are coupled together. For example, such embodiments can be used across a joint wherein the two parts are coupled together at the well site (i.e., a field joint). Using such embodiments across a joint can reduce mechanical complexity and reduce the likelihood of a breakdown because fewer electrical or other communication lines are required to pass across the joint.

Example System

FIG. 1 depicts an example pulse power drilling assembly, according to some embodiments. FIG. 1 illustrates an example drilling apparatus 100, including a pulse power drilling assembly (hereinafter "assembly") 150 positioned in a borehole 106 and secured to a length of drill pipe 102 coupled to a drilling platform 160 and a derrick 164. The assembly 150 is configured to further the advancement of the borehole 106 using pulse electrical power generated by the assembly 150 and provided to electrodes 144 in a controlled manner to break up or crush formation material of a subsurface formation along the bottom face of the borehole 106 and in the nearby proximity to the electrodes 144.

The flow of drilling fluid (illustrated by the arrow 110A pointing downward within the drill pipe 102) is provided from the drilling platform 160, and flows to and through a turbine 116, exiting the turbine 116 and flowing on into other sub-sections or components of the assembly 150, as indicated by the arrow 110B. The flow of drilling fluid through the turbine 116 causes the turbine 116 to be mechanically rotated. This mechanical rotation is coupled to an alternator sub-section or component of the assembly (hereinafter "alternator") 118 in order to generate electrical power. The alternator 118 can further process and controllably provide the electrical power to the rest of the downstream assembly 150. The stored power can then be output from the electrodes 144 in order to perform the advancement of the borehole 106 via periodic electrical discharges.

The drilling fluid flows through the assembly 150, as indicated by arrow 110B, and flows out and away from the electrodes 144 and back toward the surface to aid in the removal of the debris generated by the breaking up of the formation material at and nearby the electrodes 144. The fluid flow direction away from the electrodes 144 is indicated by arrows 110 C and 110 D. In addition, the flow of drilling fluid may provide cooling to one or more devices and to one or more portions of the assembly 150. In various embodiments, it is not necessary for the assembly 150 to be rotated as part of the drilling process, but some degree of rotation or oscillations of the assembly 150 may be provided in various embodiments of drilling processes utilizing the assembly 150, including internal rotations occurring at the turbine 116, in the alternator sub-section, etc.

As illustrated in FIG. 1, the assembly 150 includes multiple sub-assemblies, including in some embodiments the turbine 116 at a top of the assembly 150 where the top of the assembly is a face of the assembly 150 furthest from a drilling face of the assembly 150 (which contains the electrodes 144). The turbine 116 is coupled to multiple additional sub-sections or components. These additional sub-sections or components may include various combinations of the alternator 118, a rectifier 120, a rectifier controller 122, a direct current (DC) link 124, a DC to DC booster 126, a generator controller 128, a pulse power controller 130, a switch bank 134, including one or more switches 138, one or more primary capacitors 136, a transformer 140, one or more secondary capacitors 142, and the electrodes 144.

The assembly 150 can be divided into a generator 152 and a pulse power section 154. The generator 152 can include the turbine 116, the alternator 118, the rectifier 120, the rectifier controller 122, the DC link 124, the DC to DC booster 126, and the generator controller 128. The pulse power section 154 can include the pulse power controller 130, the switch bank 134, the one or more primary capacitors 136, the transformer 140, the one or more secondary capacitors 142, and the electrodes 144. Component can be divided between the generator 152 and the pulse power section 154 in other arrangements, and the order of the components can be other than shown. The assembly 150 may be comprised of multiple sub-sections, with a joint used to couple each of these sub-sections together in a desired arrangement to form the assembly 150. Field joints 112A-C can be used to couple the generator 152 and the pulse power section 154 to construct the assembly 150 and to couple the assembly 150 to the drill pipe 102. Embodiments of the assembly 150 may include one or more additional field joints coupling various components of the assembly 150 together. Field joints may be places where the assembly 150 is assembled or disassembled in the field, for example at the drill site. In addition, the assembly 150 may require one or more joints referred to as shop joints that are configured to allow various sub-sections of the assembly 150 to be coupled together (for example at an assembly plant or at a factory). For example, various components of the assembly 150 may be provided by different manufacturers, or assembled at different locations, which require assembly before being shipped to the field.

Regardless of whether a joint in the assembly 150 is referred to as a field joint or a shop joint, the center flow tubing 114 extends through any of the components that includes the center flow tubing 114. A joint between separate sections of the center flow tubing 114 or a hydraulic seal capable of sealing the flow of the drilling fluid within the center flow tubing 114 may be formed to prevent leaking at the joints.

The flow of drilling fluid passing through the turbine 116 continues to flow through one or more sections of a center flow tubing 114, which thereby provides a flow path for the drilling fluid through one or more sub-sections or components of the assembly 150 positioned between the turbine 116 and the electrodes 144, as indicated by the arrow 110B pointing downward through the cavity of the sections of the center flow tubing 114. Once arriving at the electrodes 144, the flow of drilling fluid is expelled out from one or more ports or nozzles located in or in proximity to the electrodes 144. After being expelled from the assembly 150, the drilling fluid flows back upward toward the surface through an annulus 108 created between the assembly 150 and the walls of the borehole 106.

The center flow tubing 114 may be located along a central longitudinal axis of the assembly 150 and may have an overall outside diameter or outer shaped surface that is smaller in cross-section than the inside surface of a tool body 146 in cross-section. As such, one or more spaces are created between the center flow tubing 114 and the inside wall of the tool body 146. These one or more spaces may be used to house various components, such as components which make up the alternator 118, the rectifier 120, the rectifier controller 122, the DC link 124, the DC to DC booster 126, the generator controller 128, the pulse power controller 130, the switch bank 134, the one or more switches 138, the one or more primary capacitors 136, the transformer 140, and the one or more secondary capacitors 142, as shown in FIG. 1. Other components may be included in the spaces created between the center flow tubing 114 and the inside wall of the tool body 146. The center flow tubing 114 seals the flow of drilling fluid within the hollow passageways included within the center flow tubing 114 and at each joint coupling sections of the center flow tubing 114 together and prevent the drilling fluid from leaking into or otherwise gaining access to these spaces between the center flow tubing 114 and the inside wall of the tool body 146. Leakage of the drilling fluid outside the center flow tubing 114 and within the assembly 150 may cause damage to the electrical components or other devices located in these spaces and/or may contaminate fluids, such as lubrication oils, contained within these spaces, which may impair or completely impede the operation of the assembly 150 with respect to drilling operations.

The drilling apparatus 100 can include one or more logging tools 148. The logging tools 148 are shown as being located on the drill pipe 102, above the assembly 150, but can also be included within the assembly 150 or joined via shop joint of field joint to assembly 150. The logging tools 148 can include one or more logging with drilling (LWD) or measurement while drilling (MWD) tool, including resistivity, gamma-ray, nuclear magnetic resonance (NMR), etc. The drilling apparatus 100 can also include directional control, such as for geosteering or directional drilling, which can be part of the assembly 150, the logging tools 148, or located elsewhere on the drill pipe 102.

Communication from the pulse power controller 130 to the generator controller 128 allows the pulse power controller 130 to transmit data about and modifications for pulse power drilling to the generator 152. Similar, communication from the generator controller 128 to pulse power controller 130 allows the generator 152 to transmit data about and modifications for pulse power drilling to the pulse power section. The pulse power controller 130 can control the discharge of the pulse power stored for emissions out from the electrodes 144 and into the formation, into drilling mud, or into a combination of formation and drilling fluids. The pulse power controller 130 can measure data about the electrical characteristics of each of the electrical discharges—such as power, current, and voltage emitted by the electrodes 144. Based on information measured for each discharge, the pulse power controller 130 can determine information about drilling and about the electrodes 144, including whether or not the electrodes 144 are firing into the formation (i.e. drilling) or firing into the formation fluid (i.e. electrodes 144 are off bottom). The generator 152 can control the charge rate and charge voltage for each of the multiple pulse power electrical discharges. The generator 152, together with the turbine 116 and alternator 118, can create an electrical charge in the range of 16 kilovolts (kV) which the pulse power controller 130 delivers to the formation via the electrodes 144.

When the pulse power controller 130 can communicate with the generator 152, the generator 152 and the alternator 118 can ramp up and ramp down in response to changes or electrical discharge characteristics detected at the pulse power controller 130. Because the load on the turbine 116, the alternator 118, and the generator 152 is large (due to the high voltage), ramping up and ramping down in response to the needs of the pulse power controller 130 can protect the generator 152 and associated components from load stress and can extend the lifetime of components of the pulse power drilling assembly. If the pulse power controller 130 cannot communicate with the generator 152, then the generator 152 may apply a constant charge rate and charge voltage to the electrodes 144 or otherwise respond slowly to downhole changes—which would be the case if the generator 152 is controlled by the drilling mud flow rate adjusted at the surface or another surface control mechanism.

In instances where the assembly 150 is off bottom, electrical power input to the system can be absorbed (at least partially) by the drilling fluid, which can be vaporized, boiled off, or destroyed because of the large power load transmitted in the electrical pulses. In instances where the assembly 150 is not operating correctly, such as when one or more switch experiences a fault or requires a reset, application of high power to the capacitors 136/142 or the electrodes 144 can damage circuitry and switches when applied at unexpected or incorrect times. In these and additional cases, communications or messages between the pulse power controller 130 and the generator 152 allow the entire assembly to vary charge rates and voltages, along with other adjustments discussed later. Especially where the pulse power controller 130 and generator 152 are autonomous, i.e. not readily in communication with the surface, downhole control of the assembly 150 can improve pulse power drilling function.

Example Operations

Figure 2:
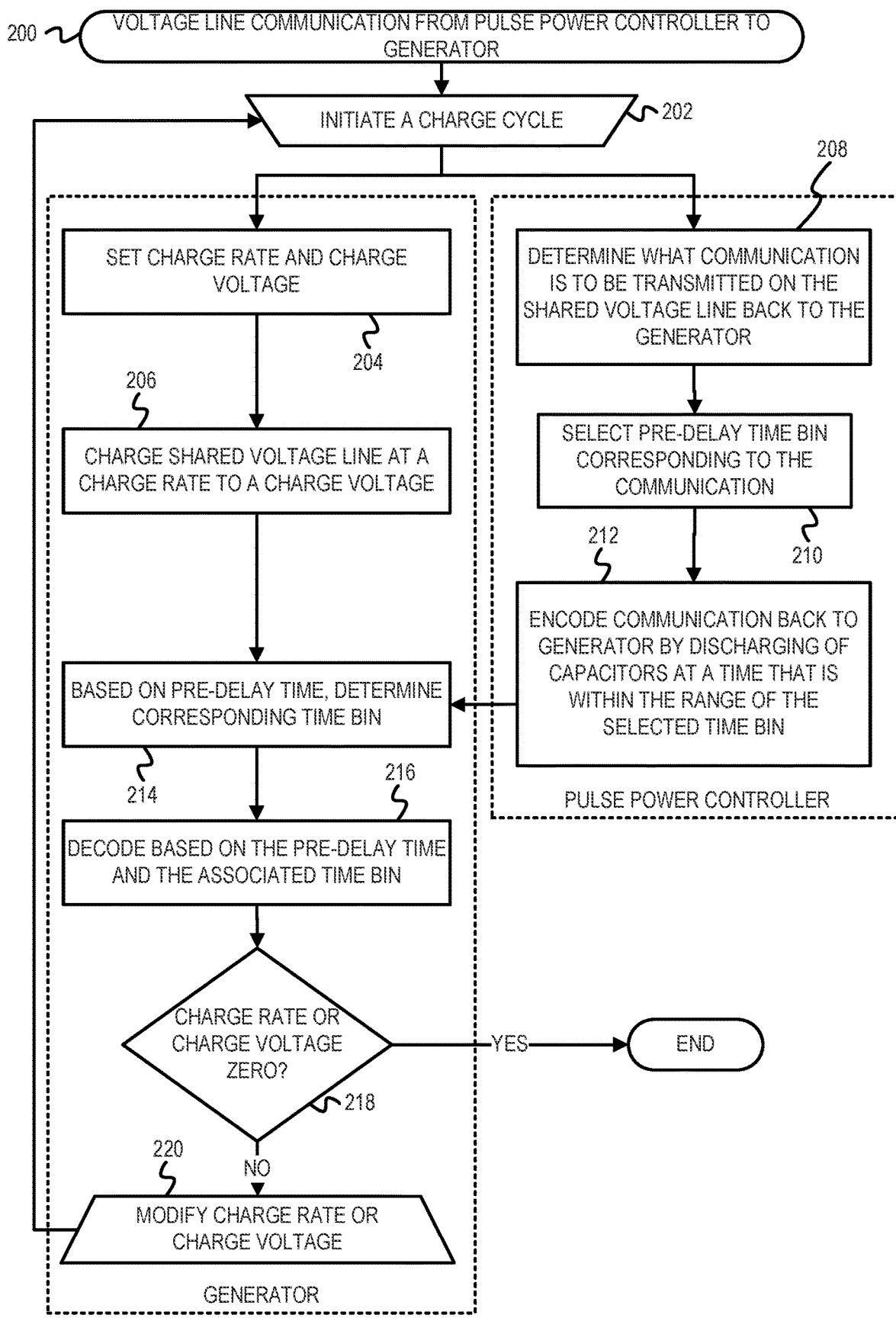
FIG. 2 depicts a flowchart of example operations for voltage line communications from a pulse power controller to a generator during pulse power drilling, according to some embodiments.

FIG. 2 depicts a flowchart of example operations for voltage line communications from a pulse power controller to a generator during pulse power drilling, according to some embodiments. A flowchart 200 of FIG. 2 includes operations described as performed by a controller or computer of the generator and by the pulse power controller for consistency with the earlier description. Such operations can be performed by hardware, firmware, software, or a combination thereof. However, assembly component naming, division, sub-section organization, program code naming, organization, and deployment can vary due to arbitrary operator choice, assembly ordering, programmer choice, programming language(s), platform, etc. Additionally, operations of the flowchart 200 are described in reference to the example drilling apparatus 100 of FIG. 1. The flowchart 200 includes the operations of blocks 202, 204, 212, 214, 216, and 218 as performed by the generator 152, and the operations of block 206, 208, and 210 as performed by the pulse power controller 130. One or more of the operations described as being performed by the generator 152 may be performed by one or more of the alternator 118, a controller of the generator 152, or a processor of the generator 152. One or more of the operations described as being performed by the pulse power controller 130 may instead be performed by a processor of the pulse power controller 130, or performed in concert with one or more switches of the pulse power controller 130.

FIG. 2 includes operations related to electrical charging and discharging of capacitors or other electrical components whose electrical discharge is emitted out into the formation through electrodes 144. In some implementations, the generator 152 and the pulse power controller 130 share a wired electrical connection or line (hereinafter "the voltage line") that transfers voltage and current over a field joint (or any other type of joint or junction). The generator 152 can control a voltage charging cycle, while the pulse power controller 130 can control the voltage discharge. By modifying various parts of the charge and discharge cycle, the generator 152 and the pulse power controller 130 can communicate data over the voltage line while also continuing to drill using periodic electric discharges being discharged from the electrodes 144.

At block 202, a charge cycle is initiated. For example, with reference to the assembly 150 of FIG. 1, a charge cycle can be initiated for the generator 152 and the pulse power controller 130. The generator 152 and the pulse power controller 130 can have independent clocks or clocks that are synched to one or more events of the charge cycle. Therefore, the start of the charge cycle—which is based on the end of the previous charge cycle or the beginning of charging of the voltage line—can be measured as beginning at different times in the generator 152 and the pulse power controller 130. For a first charge cycle or a charge cycle for which previous cycle data is not available, the charge cycle beginning can be determined by the generator 152, which initiates a first charging of the voltage line based on electrical charging via the alternator 118 by the turbine 116 which is controlled by drilling mud flow. A time difference between the beginning of a given charge cycle as measured by the generator 152 and the pulse power controller 130 is a result of separate clocks and can further be confounded by measurement accuracy. Because communication between the pulse power controller 130 and the generator 152 is based on charge cycle characteristics and time lengths, communication times and measurements can be larger than clock error or uncertainty or measurement resolution limits. Block 202 begins a loop for each charge cycle that continues for the generator 152 at block 204 and for the pulse power controller 130 at block 208.

At block 204, a charge rate and charge voltage for the current charge cycle are set. For example, with reference to the assembly 150 of FIG. 1, the generator 152 can set the charge rate and voltage for the current charge cycle. In some embodiments, the charge rate and charge voltage can be iteratively adjusted by communication between the pulse power controller 130 and the generator 152 for each charge cycle. The current charge rate and charge voltage for a first cycle or any cycle for which previous cycle data is not available can be pre-programmed to correspond to a baseline or minimum charge rate (and maximum charge time) and charge voltage commensurate with a ramp up cycle. For a subsequent charge cycle, the charge rate and charge voltage can be determined by the generator 152 based on the charge rate and charge voltage of the previous cycle and any communication detected by the generator 152 from the pulse power controller 130.

At block 206, a shared voltage line is charged at the charge rate and to the charge voltage set in block 204. For example, with reference to the assembly 150 of FIG. 1, the generator 152 can charge the shared voltage line. For example, the generator 152 can apply the electric potential generated by the turbine 116, the alternator 118, etc. to the shared voltage line that connects the generator 152 to the capacitors 136 or other electrical components of the pulse power section 154. From block 206, flow continues to block 214.

At block 208, a determination of what communication is to be transmitted on the shared voltage line back to the generator is made. For example, with reference to the assembly 150 of FIG. 1, the pulse power controller 130 can make this determination. For instance, based on the electrical discharge characteristics of the previous cycle, the pulse power controller 130 can determine that a communication needs to be transmitted back to the generator 152 regarding a modification to the charge rate and charge voltage. Example communications sent from the pulse power controller 130 to the generator 152 can include: increase charge rate, decrease charge rate, increase charge voltage, decrease charge voltage, increase a post-delay time, decrease a post-delay time, initiate emergency shutdown, etc. The post-delay time can be defined as the time between the electrical discharge of one discharge cycle and the charging of the next cycle. In some embodiments, the number of different communications that the pulse power controller 130 can select from to send to the generator 152 can be determined by a minimum pre-delay time, a maximum pre-delay time, and a bin resolution. A pre-delay time can be defined as the length of time between the end of the charging by the generator 152 (i.e. when the voltage line reaches the charge voltage) and the discharge of that voltage by the pulse power controller 130. During the pre-delay time, voltage on the voltage line can be relatively constant.

Figure 3:
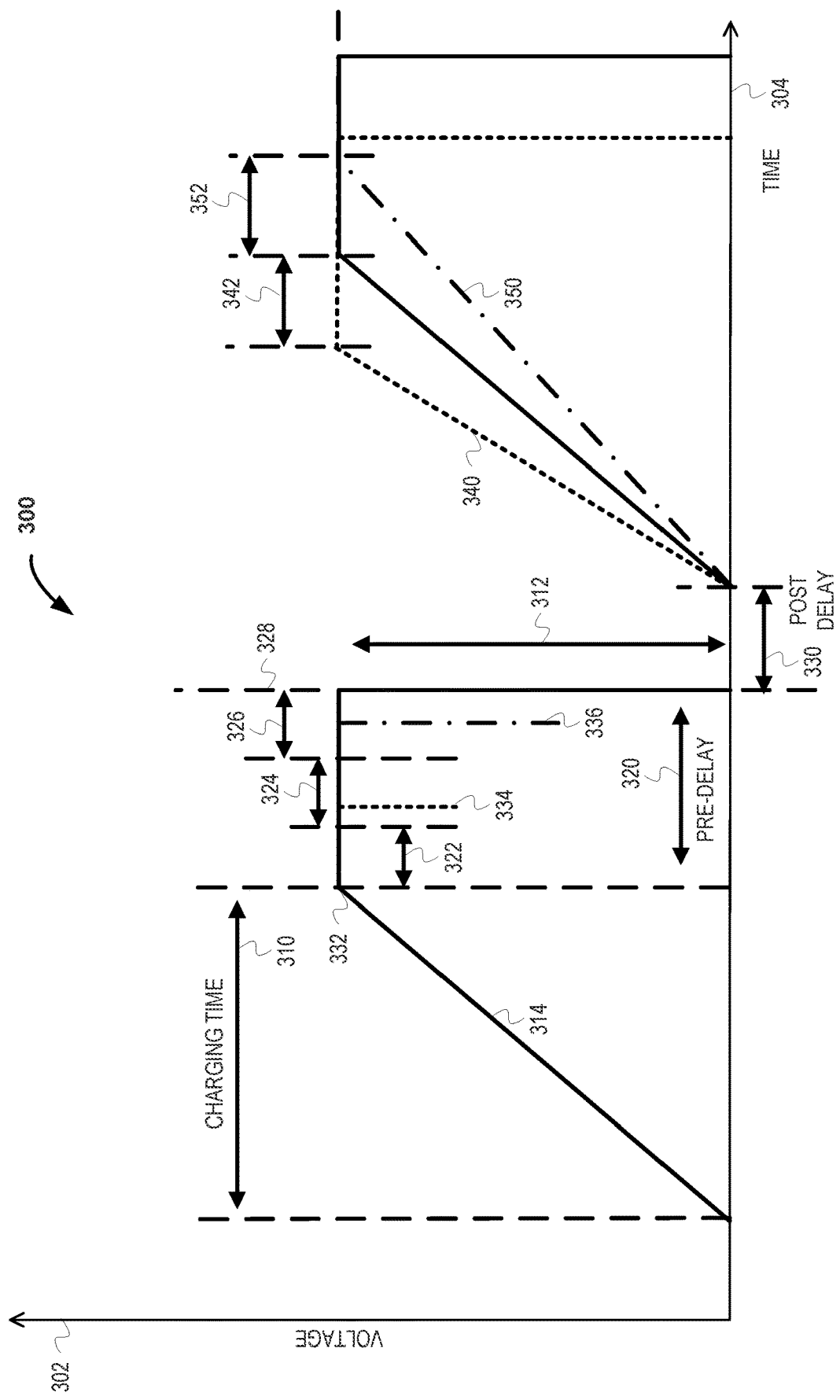
FIG. 3 depicts a graph of voltage over time for an example two bin communication from pulse power controller to generator, according to some embodiments.

To illustrate, FIG. 3 depicts a graph of voltage over time for an example two bin communication from pulse power controller to generator, according to some embodiments.

FIG. 3 depicts a graph 300 displaying an example plot of voltage (on a y-axis 302) of the voltage line as a function of time (on an x-axis 304). The graph 300 of FIG. 3 is described in reference to the example drilling apparatus 100 of FIG. 1. A charging time 310 is depicted during which the generator 152 applies increasing voltage, i.e. charges, the voltage line connecting the generator 152 and the pulse power controller 130. A charging rate 314 is the slope of the voltage curve during the charging time, which is a charge voltage 312 divided by the charging time 310 for a linear charge rate. A pre-delay time 320 is the time between when the voltage has reached the charge voltage 312 and when the voltage is discharged by the pulse power controller 130 at a discharge time. A maximum pre-delay time 328 can be defined as the maximum time the pulse power controller 130 will allow voltage along the shared voltage line. This maximum pre-delay time 328 can be necessary because periodic discharging of the electrodes can be required to protect components of the generator 152 that continue to generate electrical power which can overwhelm available locations to store such power without such discharging. A minimum pre-delay time 322 can be defined as the minimum time the pulse power controller 130 requires to effectively determine that the generator 152 has stopped charging and to fire one or more switches 138 to generate the discharge of the stored voltage. In this example, between the minimum pre-delay time 322 and the maximum pre-delay time 328, two time bins are depicted. A first bin 324 and a second bin 326 can correspond to any assigned communication as programmed in the pulse power controller 130 and the generator 152.

The pre-delay time 320 for each cycle is measured from an inflection point 332 where the charging time 310 ends and the voltage is steady at the charge voltage 312. The pre-delay time 320 length falls in either the first bin 324, where an example pre-delay time 334 is shown, or in the second bin 326, where an example pre-delay time 336 is shown. In this example, the first bin 324 is shown as corresponding to an increase in charging rate and a decrease in charging time and the second bin 325 is shown as corresponding to a decrease in charging rate and an increase in charging time. In one or more embodiments, different bin assignments could be used, such as bits 0 and 1, or bin orders could be reversed. Additionally, bins can be different time lengths as permitted by resolution uncertainty. A first bin can overlap with or include the minimum pre-delay time 322.

The pre-delay time 320 of the first cycle effects the charge rate of the second cycle, as shown. After discharge, a post-delay time 330 separates the beginning of the charging time of the second cycle from discharge of the first cycle. The post-delay time 330 allows electrical switches, such as the one or more switches 138, to be operated and ensures that the pulse power controller 130 has fully discharged the capacitors 136 and 142 and protects the generator 152 and alternator 118 from power load shocks. After the post-delay time 330, the generator 152 again charges the voltage line at a second cycle charging rate. An increased charging rate 340 and a charging time decreased by interval 342 for the second cycle corresponds to a pre-delay time within the first bin 324 of the first cycle, while a decreased charging rate 350 and a charging time increased by interval 354 for the second cycle corresponds to a pre-delay time within the second bin 326 of the first cycle. The change in the charging rate can be pre-programmed as a specific value (i.e. a $\Delta V/s$ in volts per second), as a specific value for an increase and a specific value for a decrease (i.e. $\Delta V/sec_{increase} \neq \Delta V/sec_{decrease}$), a percentage change (e.g. $\Delta V/sec$ is equal to one percent (1%) of the previous charging rate), a percentage change for an increase and a percentage change for a decrease (e.g. $\Delta V/sec_{increase}$ is 1% of the previous charging rate and $\Delta V/sec_{decrease}$ decrease is 5% of the previous charging rate), etc. In one or more embodiments, the change in the charging rate can be pre-programmed as a change in the charging time 310. In one or more embodiments, the change in the charging time 310 can be pre-programmed as a specific value (i.e. ±1 millisecond (ms)), a percentage change (e.g. $\Delta t_{charging}$ is equal to 1% of $t_{charging}$), or different values for time increases and time decreases.

The increased charging rate 340 means that the generator 152 reaches the charge voltage 312 at an earlier time that it would if the charging rate were unchanged. The decreased charging rate 350 means that the generator 152 reaches the charge voltage 312 at a later time than it would if the charging rate was unchanged. The pre-delay time of the second cycle likewise effects the charging rate of a third cycle (not shown), and so forth. In one or more embodiments, the generator 152 can treat a communication to change the charging rate as a communication to also adjust the post-delay time 330 in order to maintain discharge of the capacitors 136 and 142 as a pre-determined frequency.

In one or more embodiment, the first bin 324 and the second bin 326 can instead be assigned to bit values. If the bins correspond to bit values, such as 0 and 1 or −1 and +1, the pulse power controller 130 can communicate one or more communication or modification to the generator 152 over one or more charge cycles. For instance, the generator 152 can determine that, if the bins correspond to bits 0 and 1, for an average bit value greater than 0.5 the charge rate is increased, for an average bit value less than 0.5 the charge rate is decreased, and for an average bit value of 0.5 the charge rate is unchanged. In a similar manner, charge voltage 312 or post-delay time 330 can be adjusted.

The minimum pre-delay time 322 corresponds to a minimum length of time necessary for the pulse power controller 130 to detect that the generator 152 has reached the charge voltage 312 and is no longer charging. The detection of a steady voltage can be complicated by the different clocks by which time is measured at the generator 152 and the pulse power controller 130, and by the ability of the pulse power controller 130 to detect the point at which voltage is steady. Because the voltage can be large (for example, 16 kV) and the charging time 310 fast (for example, 17 ms), the detection of the inflection point 332 between charging voltage and steady state voltage can be complicated by any voltage overshoot or ripple. The pulse power controller 130 can measure and record voltage as a function of time and can detect when the charging period ended and the pre-delay time 320 began by looking backwards over the recorded data.

The maximum pre-delay 328 time corresponds to a maximum length of time that is allowed by the generator 152 and pulse power controller before initiating a shutdown or failsafe mode, such as emergency off (EMO) or other protocol. The pulse power controller 130 and generator 152 can include a failsafe that triggers a shutdown of the generator 152, the alternator 118, and the turbine 116 and a discharge of the electrodes 144 if the maximum pre-delay time 328 is reached. The maximum pre-delay time 328 protects the assembly 150 from catastrophic overcharging of electrical components, such as the capacitors 136/142 and electrodes 144. If, for example, the pulse power controller 130 switches 138 are malfunctioning and the electrodes 144 are not discharging, in the absence of the maximum pre-delay time 328 the pulse power controller 130 would continue to charge until electrical breakdown occurred in the assembly 150 or the generator 152 experienced load failure. The maximum pre-delay time 328 is chosen based on the assembly 150 electrical and design parameters, such as dielectric breakdown voltages, capacitive strength, operating voltages, maximum current, etc. and can vary as a function of the specific assembly 150. The maximum pre-delay time 328 institutes a failsafe that can preserve the assembly for further use.

The time between the minimum pre-delay time 322 and the maximum pre-delay time 328 is divided into bins, where each bin corresponds to a time long enough for both the generator 152 and the pulse power controller 130 (with their independent clocks) to agree on bin identification, which depends on measurement resolution. Each bin corresponds to a communication or identified modification. In one or more embodiments, each bin corresponds to bit of data, where communications or identified modifications are transmitted in bits over one or more charge cycles.

In cases where the pulse power controller 130 determines that the electrodes 144 are discharging successfully into the formation, the pulse power controller 130 determines that charge rate and charge voltage 312 can be raised to a maximum charge rate and charge voltage in order to expedite pulse power drilling. In one or more embodiment, charge voltage is constant and a function of assembly 150 parameters. In other embodiments, charge voltage is adjustable between a minimum charge voltage and a maximum charge voltage. Based on a determination that pulse power drilling is proceeding correctly with discharge into the formation, communications corresponding to increase charge rate or increase charge voltage can be transmitted to the generator 152. In one or more embodiment, a maximum charge rate and maximum charge voltage can be determined based on pre-programmed assembly limits, based on alternator 118 output, based on drilling mud flow rate to the turbine 116, etc. In response to communications from the pulse power controller 130 to increase either charge rate or charge voltage 312, the generator 152 can determine that charge rate or charge voltage 312 are currently at a maximum and treat communications indicating further increases as communications to maintain the maximum charge rate or charge voltage 312.

In cases where the electrodes 144 are determined to not be discharging successfully into the formation, which can be due to off-bottom electrodes 144 or to electrical malfunctions or reset operations, the charge rate and charge voltage can be lowered to a minimum charge rate and minimum charge voltage. In one or more embodiments, charge rate is adjusted while charge voltage 312 is constant. The pulse power controller 130 can transmit, in response to a determination that drilling power is to be ramped down, communications to reduce charge rate or reduce charge voltage 312. In one or more embodiments, a minimum charge rate or minimum charge voltage can be determined based on pre-programmed assembly limits, based on alternator 118 output, based on drilling mud flow rate to the turbine 116, etc. In response to communications from the pulse power controller 130 to decrease either charge rate or charge voltage 312, the generator 152 can determine that charge rate or charge voltage 312 are currently at a minimum and treat communications indicating further reductions as communications to maintain the minimum charge rate or charge voltage 312. In one or more embodiments, the generator 152 can determine that the charge rate or charge voltage 312 are currently at a minimum and can treat communications indicating further reductions in charge rate as communications to instead reduce charge voltage and communications indicating further reductions in charge voltage as communications to also reduce charge rate. In one or more embodiments, the generator 152 can determine that at least one of the charge rate or charge voltage 312 is currently at a minimum and can treat communications indicating further reductions in charge rate or charge voltage 312 as communications to reduce charge cycle frequency (which also reduces total energy emitted by the pulse power electrodes) by increasing the post-delay time 330, which is the time between the discharge of the electrodes by the pulse power controller 130 and the beginning of the charging by the generator 152. In one or more embodiments, the generator 152 can determine that at least one of the charge rate or charge voltage 312 is currently at a minimum and can treat communications indicating further reductions in charge rate or charge voltage as communications to enter a reset or temporary shutdown mode, which can include increased pre-delay time, reduced charging rate, reduced charging voltage, alternator 118 slowdown, etc.

Returning to operations of the flowchart 200 of FIG. 2, from block 208 flow continues to block 210. At block 210, a pre-delay time bin corresponding to the communication is selected. The pre-delay time bin is selected for communication based on the corresponding modification determined by the operations at block 208. For example, with reference to the assembly 150 of FIG. 1, the pulse power controller 130 can select the pre-delay time bin. For example, the pulse power controller 130 can select a time length (which controls timing of the discharge by triggering one or more switches which cause electrical discharge of the stored voltage for emission from the electrodes 144). The selected time length will be a time within the bin corresponding to the communication or modification determined in block 208. In one or more embodiments, a pre-delay time is selected based on both the communication or modification determined in block 208 and on an encoding scheme, shift, or averaging method pre-selected or preprogrammed in both the generator 152 and the pulse power controller 130. In some implementations, two or more consecutive identical communications can be delivered before the generator 152 modifies charge cycle parameters, in order to protect against transmission or pre-delay time identification errors. Additionally, communications or determined modifications can be transmitted encoded within bits corresponding to pre-delay time bins. In one or more embodiments, communications or determined modifications, which correspond directly to pre-delay time bins, can be transmitted as well as additional multi-charge cycle communications or commands by encoding on top of or ordering of the transmitted pre-delay times, such as using Manchester encoding. From block 210, flow continues to block 212.

At block 212, the encoded communication is sent to the generator by discharging of the capacitors at a time that is within the range of the selected pre-delay time bin. At least one capacitor or pulse power electrode is discharged at the selected pre-delay time. For example, with reference to the assembly 150 of FIG. 1, the pulse power controller 130 discharges the capacitors 136 at the selected pre-delay time 320. To illustrate, the pulse power controller 130 can detect when the voltage on the voltage line has reached steady state. Based on the selection of the pre-delay time 320 from block 210, the pulse power controller 130 can switch one or more switches to thereby isolate the generator 152 from the load and discharging the capacitive charge from the capacitors 136 or other electrical elements and through the electrodes 144 and from there into the formation or drilling fluid. From block 212, flow continues to block 214 at the generator 152.

Flow continues to block 214 from block 206 of the generator 152 operations and from block 212 of the pulse power controller 130 operations.

At block 214, a corresponding time bin is determined based on the pre-delay time. For example, with reference to the assembly 150 of FIG. 1, the generator 152 makes this determination. In reference to the example of FIG. 3, the pre-delay time 320 is measured. The generator 152 can then determine which bin includes the pre-delay time 320. The generator 152 can measure the time between when voltage reaches a steady state and the time of the discharge of voltage by the pulse power controller 130. The time length of each bin can be defined as long enough to allow the generator 152 to correctly identify the pre-delay time 320 and corresponding bin even though the pulse power controller 130 and generator 152 run on separate clocks. The time length of a bin can also account for measurement error, including the pulse power controller 130 uncertainty in identifying the end of charging portion of the charge cycle (which is the beginning of the steady, voltage portion of the charge cycle). From block 214, flow continues to block 216.

At block 216, communication on the voltage line is decoded based on the pre-delay time and the associated bin. For example, with reference to the assembly 150 of FIG. 1, the generator 152 decodes the communication based on the measured pre-delay time. Modification to the charge rate and charge voltage is determined based on the determined time bin. the communication or determined modification encoded by the pulse power controller 130 in the bin corresponding to the pre-delay time is identified by the generator 152. Bins can correspond to any communication, as long as the pulse power controller 130 and generator 152 agree on bin identity. In one or more embodiments, a first bin corresponding to the minimum pre-delay time 322 plus a time length to decrease errors or uncertainty in detection can correspond to the communication or modification used most frequently—such as a maintain or no modification communication. In one or more embodiments, bin time lengths can be unequal. In one or more embodiments, bins can correspond to bits where communications are decoded based on two or more charge cycles. The generator 152 can also determine if the determined modification is allowable, based on maximum and minimum charge rates, charge voltages, post-delay times, etc. From block 216, flow continues to block 218 where the communication is decoded.

At block 218, the charge rate and charge voltage are compared to zero. For example, charge rate or charge voltage is checked to determine if the charge rate or charge voltage is zero or below a minimum charge rate or charge voltage. For example, with reference to the assembly 150 of FIG. 1, the generator 152 can determine if the charge rate or charge voltage is zero, or another below a minimum charge rate or charge voltage. A charge rate or charge voltage of zero or otherwise below the minimum charge rate or charge voltage for drilling corresponds to a shutdown, failsafe, or emergency off procedure. In one or more embodiment, an infinite post-delay time can also correspond to a shutdown procedure. If the charge voltage or charge rate is zero or below a minimum charge rate of charge voltage, the flow can end. If the charge voltage or charge rate is not zero, i.e. has a value for a subsequent charge cycle, flow can continue to block 202 for another charge cycle.

At block 220, the charge rate or charge voltage is modified. For example, one or more parameter, i.e. charge rate, charge voltage, etc., setting is modified or adjusted for the next cycle. For example, with reference to the assembly 150 of FIG. 1, the generator 152 can modify or adjust one or more parameter for a subsequent cycle. Block 220 indicates the termination of a charge cycle, although charge cycle beginning and ending can be arbitrary. From block 220, flow continues to block 202, where another charge cycle begins.

Figure 4:
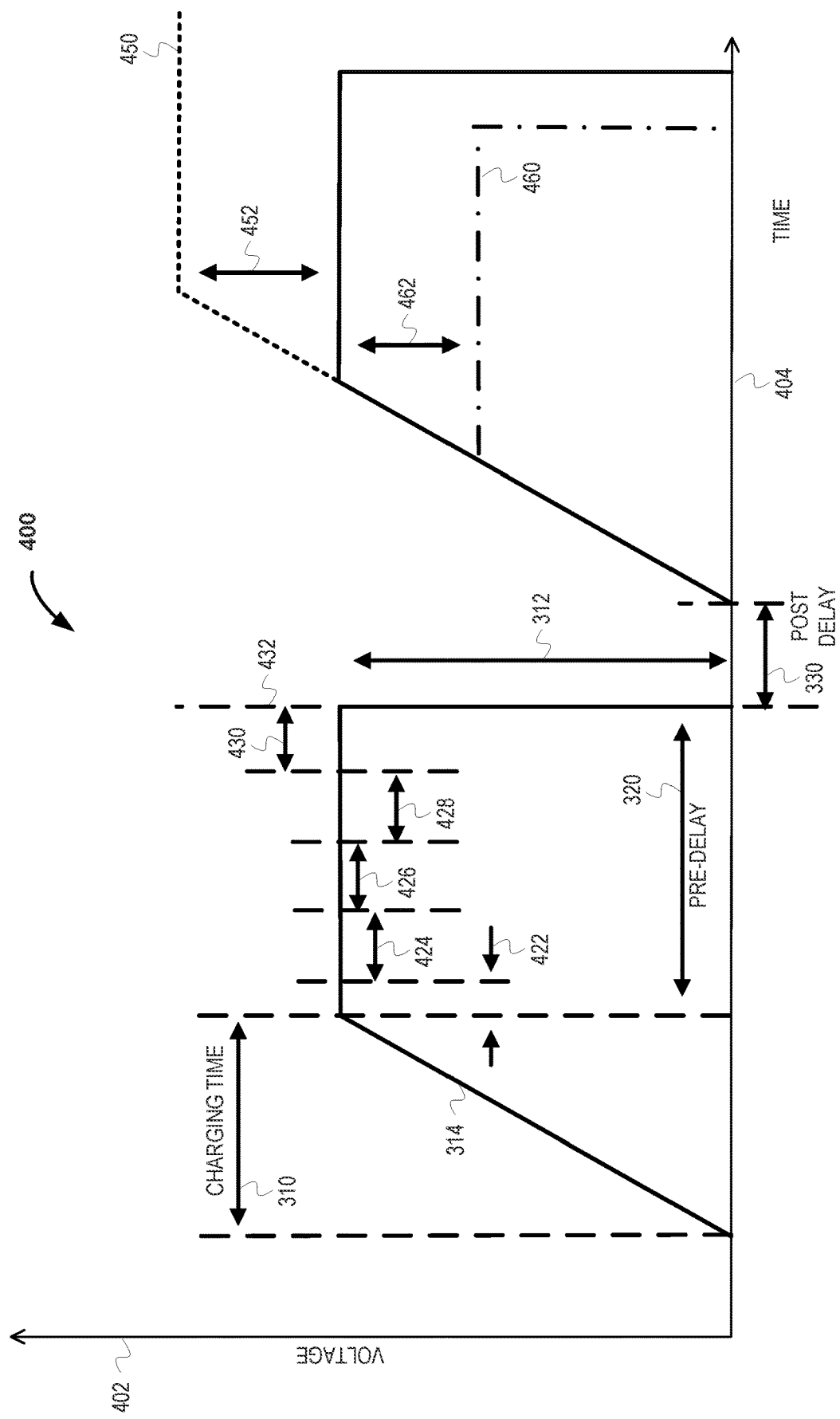
FIG. 4 depicts a graph of voltage over time for an example four bin communication from pulse power controller to generator, according to some embodiments.

To further illustrate, FIG. 4 depicts a graph of voltage over time for an example four bin communication from pulse power controller to generator, according to some embodiments. FIG. 4 depicts a graph 400 displaying an example plot of voltage (on a y-axis 402) of the voltage line as a function of time (on an x-axis 404). The charging time 310 is the time during which the generator 152 applies increasing voltage, while the charging rate 314 is the rate of voltage increase during the charging time 310. The pre-delay time 320 is the time between when the voltage has reached the charge voltage 312 and the discharge time. A maximum pre-delay time 432 and a minimum pre-delay time 422 are also shown, which bound allowable discharge times. Between the minimum pre-delay time 422 and the maximum pre-delay time 432, four time bins are depicted. A first bin 424, a second bin 426, a third bin 428, and a fourth bin 430 can correspond to any assigned communication as programmed in the pulse power controller 130 and the generator 152.

In one or more embodiments, the time between the minimum pre-delay time 422 and the maximum pre-delay time 432 can be divided into more than two time bins, such as the four time bins depicted in FIG. 4. In one or more embodiments, the first bin 424 corresponds to communication increasing the charging rate, the second bin 426 corresponds to a communication decreasing the charging rate, the third bin 428 corresponds to a communication increasing the charge voltage, and the fourth bin 430 corresponds to a communication decreasing the charge voltage. In one or more embodiments, different bin assignment could be used, such as bits 0, 1, 2, and 3, or bin assignment orders could be different. In one or more embodiments, most commonly used communications can be assigned to earlier bins with later bins corresponding to less commonly used communications in order to reduce average pre-delay time. A reduced average pre-delay time can increase pulse power electrode discharge frequency. In one or more embodiments, greater or fewer number of bins can be used.

FIG. 4 additionally depicts a second cycle after the post-delay time 330. For an example pre-delay time corresponding to the third bin 428, a second cycle with an increased charge voltage 450 is shown. For an example pre-delay time corresponding to the fourth bin 430, a second cycle with a decreased charge voltage 460 is shown. The change in charge voltage can be pre-programmed as a specific value (i.e. a $\Delta V$ in volts), as a specific value for an increase and a specific value for a decrease (i.e. $\Delta V_{increase} \neq \Delta V_{decrease}$), a percentage change (e.g. $\Delta V$ is equal to one percent (1%) of the previous charge voltage), a percentage change for an increase and a percentage change for a decrease (e.g. $\Delta V_{increase}$ is 1% of the previous charge voltage and $\Delta V_{decrease}$ decrease is 5% of the previous charge voltage), etc. An example voltage change increase 452 is the difference between charge voltage 312, the charge voltage of the previous cycle, and increased charge voltage 450. An example voltage change decrease 462 is the difference between charge voltage 312 of the previous cycle and decreased charge voltage 460. As the charge rate is unchanged, an increase or decrease in charge voltage changes the charging time for a second cycle. In one or more embodiment, the generator 152 can treat a communication to change the charge voltage as a communication to change both the charging rate and the charge voltage in order to maintain a charging time.

Figure 5:
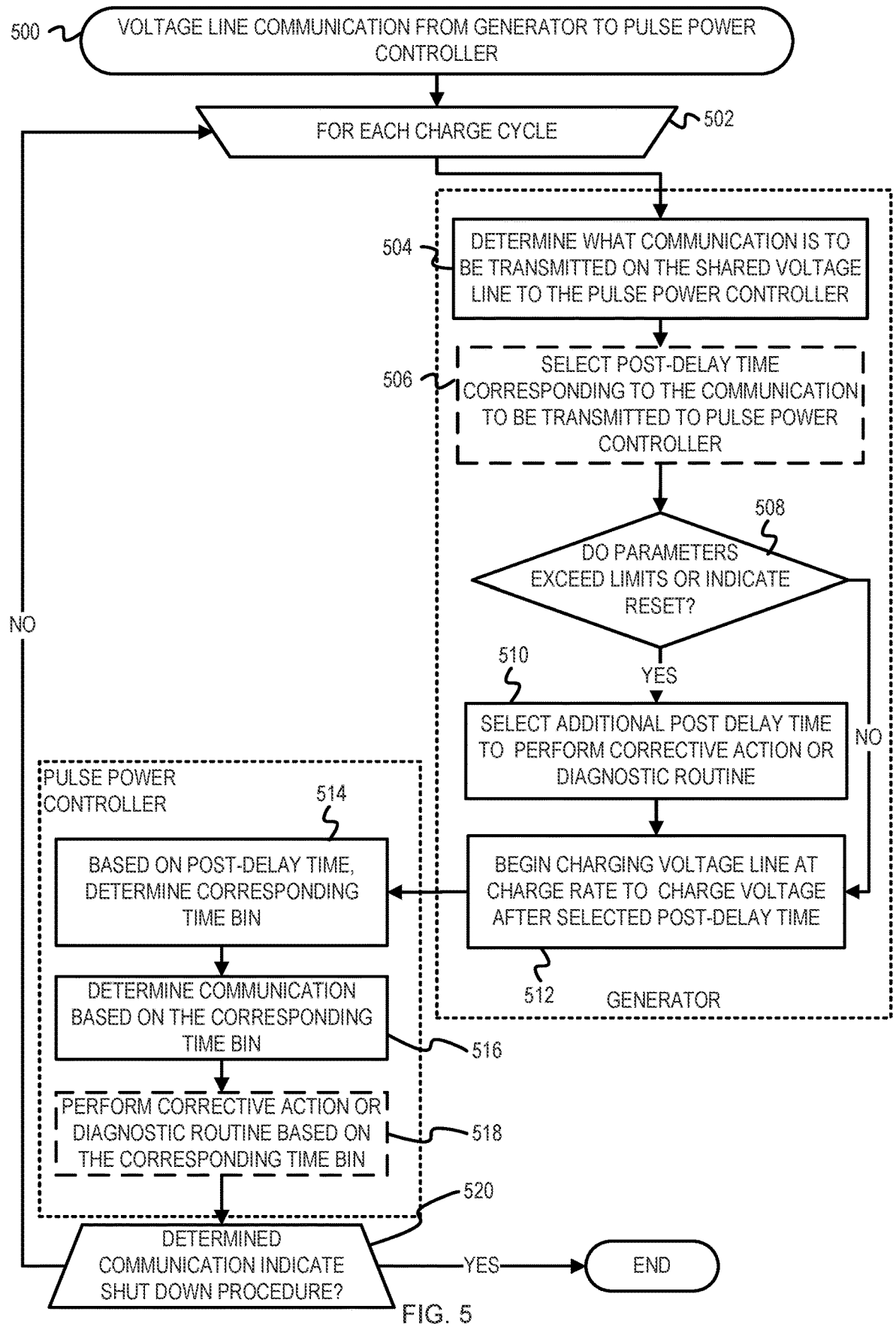
FIG. 5 depicts a flowchart of example operations for voltage line communications from a generator to a pulse power controller, according to some embodiments.

FIG. 5 depicts a flowchart of example operations for voltage line communications from a generator to a pulse power controller, according to some embodiments. Similar to the operations of the flowchart 200 of FIG. 2, operations of a flowchart 500 of FIG. 5 include communications that are also transmitted along the shared voltage line. However, operations of the flowchart 500 include communications going in the direction opposite of the communications of the flowchart 200 of FIG. 2. The flowchart 500 includes operations described as performed by the generator and the pulse power controller for consistency with the earlier description. Such operations can be performed by hardware, firmware, software, or a combination thereof. However, assembly component naming, division, and sub-section organization, and program code naming, organization, and deployment can vary due to arbitrary operator choice, assembly ordering, programmer choice, programming language(s), platform, etc. Additionally, operations of flowchart 500 are described in reference to the example drilling apparatus 100 of FIG. 1. The flowchart 500 includes the operations of blocks 504, 506, 508, 510, and 512 as performed by the generator 152, and the operations of block 514, 546, and 518 as performed by the pulse power controller 130. One or more of the operations described as being performed by the generator 152 may be instead performed by the alternator 118, a controller of the generator 152, or a processor of the generator 152. One or more of the operations described as being performed by the pulse power controller 130 may instead be performed by a processor of the pulse power controller 130 or performed in concert with one or more switches of the pulse power controller 130. Additionally, the operations depicted as performed by the generator 152 in block 506 can be performed before or after the operations of block 508, 510, and 512.

FIG. 5 depicts a flowchart of example operations for voltage line communications from the generator 152 to the pulse power controller 130, according to some embodiments. The generator 152 can control a voltage charging cycle, while the pulse power controller 130 can control the voltage discharge. By modifying various parts of the charge and discharge cycle, communication between the generator 152 and pulse power controller 130 can be enabled over the voltage connection while the electrodes 144 can continue to drill via electrical discharging.

At block 502, a charge cycle is initiated. For example, with reference to the assembly 150 of FIG. 1, a charge cycle can be initiated for both the generator 152 and the pulse power controller 130. The start of the charging cycle can be measured from the discharge of the previous cycle. A post-delay time (which will be discussed in reference to FIG. 6), between when the generator 152 detects the discharge of the previous cycle and when the generator 152 begins charging of the voltage line for the current cycle, can be measured by both the generator 152 and the pulse power controller 130. As previously discussed in reference to FIG. 2, the generator 152 and the pulse power controller 130 can have independent clocks, in which case there can be disagreement on the exact beginning of each cycle between the generator 152 and the pulse power controller 130. In order to reduce errors and simplify communication, time bins can be used to account for discrepancy in measurement or clock times when communicating between the generator 152 and the pulse power controller 130. Block 502 begins a loop for each charge cycle that continues for the generator 152 at block 504. In one or more embodiments, flow from block 502 can also optionally continue to block 514 of the pulse power controller 130. Alternatively, the start of each cycle can be detected by the pulse power controller 130 when the generator 152 begins charging of the voltage line. Such an example is described in reference to a flow of operations from block 512 to 514 as will be discussed later.

Figure 6:
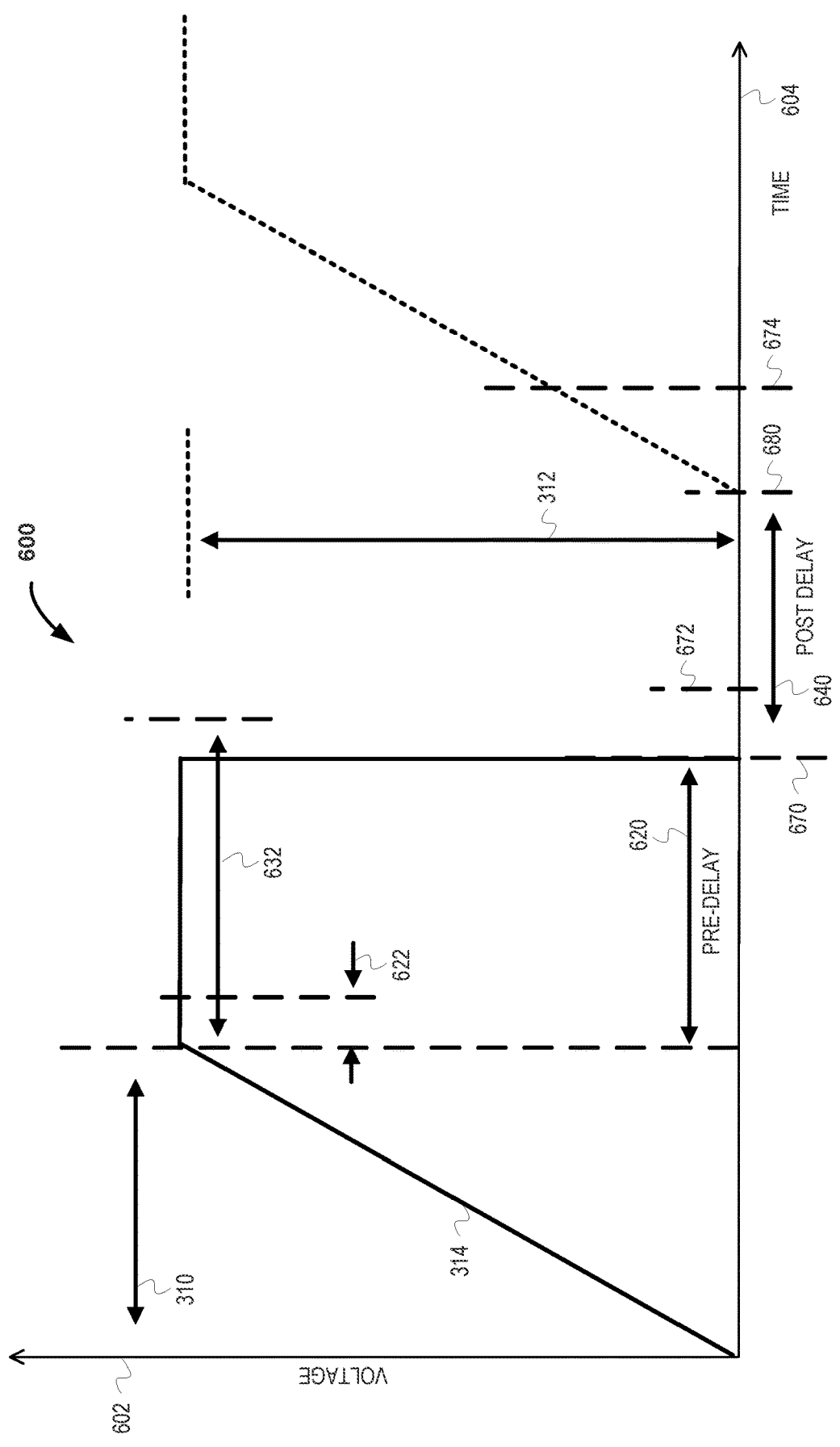
FIG. 6 depicts a graph of voltage over time for an example communication from the generator to the pulse power controller, according to some embodiments.

To illustrate, FIG. 6 depicts a graph of voltage over time for an example communication from the generator to the pulse power controller, according to some embodiments. FIG. 6 depicts a graph 600 displaying an example plot of voltage (on a y-axis 602) of the voltage line as a function of time (on an x-axis 604). The graph 600 of FIG. 6 is described in reference to the example drilling apparatus 100 of FIG. 1. The charging time 310 is when the generator 152 applies increasing voltage on the voltage line connecting the generator 152 and the pulse power controller 130. The charging rate 314 is the slope of the voltage curve during the charging time 310 to the charge voltage 312. A minimum pre-delay time 622 and a maximum pre-delay time 632 are shown, along with a discharge time 670 when the pulse power controller 130 discharges the voltage through the electrodes 144. A pre-delay time 620 corresponds to the measured time difference between the discharge time 670 and the end of the charging time 310. A minimum post-delay time 672 and a maximum post-delay time 674 are also shown. A post-delay time 640 corresponds to the measured time difference between the discharge time 670 and the beginning of the second cycle at time 680. The time period between the minimum post-delay time 672 and the maximum post-delay time 674 is divided into bins such that the post-delay time 640 corresponds to a single bin. Bins can vary in length. The maximum post-delay time 674 can correspond to a shut down time or a communication initiating a corrective or diagnostic window.

Returning to FIG. 5 at block 504, the communication to be transmitted on the shared voltage line to the pulse power controller is determined. Optionally, the charge cycle parameters, which can include the charge rate, the charge voltage 312 and the post-delay time 640, are determined for the current charge cycle based on modifications from a previous cycle or pre-programmed values. For example, with reference to the assembly 150 of FIG. 1, the generator 152 can determine parameters for the current charge cycle. The charge rate and charge voltage 312 can be iteratively adjusted by communication between the pulse power controller 130 and the generator 152 for each charge cycle, as described in reference to FIGS. 2-4. For a first charge cycle or any charge cycle for which the generator 152 does not have previous cycle data, the charge cycle parameters can be pre-programmed or set to baseline, minimum, or maximum values. In one or more embodiment, the post-delay time 640 can be adjusted by the generator 152 to fall into a time bin that correspond to pre-determined communications or requests for modifications from the generator 152 to the pulse power controller 130. In one or more embodiments, the post-delay time 640 can be adjusted by the generator 152 in response to a communication or requested modification sent from the pulse power controller 130 to the generator 152. For example, the post-delay time 640 can be extended in response to a pulse power controller request to reduce the charging rate or reduce the charge voltage when the charging rate and charge voltage are at minimum values. Flow continues from block 504 to block 506.

At block 506, a post-delay time is selected corresponding to the communication to be transmitted to the pulse power controller. For example, with reference to the assembly 150 of FIG. 1, the generator 152 can select the post-delay time 640. For example, the generator 152 can determine that the generator 152 (or associated components), the pulse power controller 130, or one or more switches of the pulse power controller 130 is malfunctioning or otherwise is to be reset. Accordingly, the generator 152 can select a post-delay time that corresponds to a reset command. In another example, if a change in the electrode 144 location, alternator 118 operation, flow of drilling mud or other signal is detected, the generator can communicate that power can be ramped up or ramped down or any other pre-programmed communication to the pulse power controller 130. In one or more embodiments, the generator 152 can select a post-delay time that corresponds to a command to the pulse power controller 130 to initiate shutdown—either controlled or emergency.

As described in reference to FIG. 6, the generator 152 can communicate to the pulse power controller 130 via a selecting a post-delay time 640 between the discharge of the previous cycle and the start of the charging time 310 of the current cycle. Any communication can be transmitted by the generator 152 to the pulse power controller 130 based on pre-programmed correlations between bins or ranges of post-delay times 640 and defined communications. In one or more embodiments, post-delay time bins can be pre-assigned to two or more bits (such as 0 and 1) and any communication can be transmitted by the generator 152 to the pulse power controller 130 by encoding over one or more cycles. In one or more embodiments, time bins can be unequal lengths. Additionally, if a maximum post-delay time 674 is reached before the generator 152 begins a charging cycle, the pulse power controller 130 can treat that as a communication that drilling is stopped or paused. In some implementations, a communication can be sent to the pulse power controller 130 so that the pulse power controller 130 and the generator 152 can coordinate on a subsequent cycle. For example, the post-delay time 640 can be selected that corresponds to a communication that drilling has ended. In this case, the pulse power controller 130 receives a communication that the current cycle is the final cycle—but drilling is not stopped until the subsequent cycle when the post-delay time 640 is infinite. In one or more embodiments, communications can be assigned to one or more bins where the first bin is assigned to the most expected communication and the last bin is assigned to a communication that is least common in order to expedite the drilling rate. Flow continues from block 506 to block 508, although block 506 can optionally be performed instead after block 510.

At block 508, the parameters for the current cycle are compared to limits in order to determine if they exceed limits or indicate reset. For example, with reference to the assembly 150 of FIG. 1, the generator 152 can determine if any parameters exceed limits or indicate reset or shutdown procedures. For example, the charging rate, the charge voltage 312, and the charging time 310 can be compared to both maximum and minimum limits. If parameters exceed limits or indicate a reset is to be performed, flow continues to block 510. If parameters do not exceed limits, flow continues to block 512. In one or more embodiments, the post-delay time 640 can be increased in response to a minimum charging rate, minimum charge voltage, or maximum charging time. In one or more embodiments, the post-delay time 640 can be decreased in response to a maximum charging rate, maximum charge voltage, or minimum charging time.

Current and voltage discharged by the pulse power controller 130 to the electrodes 144 can be measured. Current draw or power load can be detected outside of a pre-selected range or change in current and power discharged to the electrodes detected between a previous cycle and a current cycle. In those cases, high or low current or high or low power discharges can correspond to malfunctioning of the electrodes 144, one or more switches, or disruption of the assembly in the wellbore. In one or more embodiments, a reset procedure can be performed by either the generator 152 or the pulse power controller 130 of one or more sub-assemblies. In some implementations, the generator 152 can transmit a communication to the pulse power controller 130 after discharge (or optionally, during a long post-delay time period) to reset or toggle switches, clear caches, or other resetting operations.

At block 510, additional post-delay time is selected to perform a corrective action or diagnostic routine. For example, with reference to the assembly 150 of FIG. 1, the generator 152 can select an additional post-delay time based on the determination that corrective action is to be performed or that a diagnostic routine is selected. A diagnostic routine can comprise one or more long post-delay times consistent with a diagnostic window in during which electrical discharges are paused. In one or more embodiments, a time window for corrective or diagnostic action can correlate to a longest post-delay time bin, shorter than the maximum post-delay time 674 indicating shutdown. Alternatively, a communication correlating to initiation of corrective or diagnostic action can be sent in a cycle while the corrective action or diagnostic routine is initiated during the post-delay time 640 in a subsequent cycle. In one or more embodiments, the assembly 150 can enter a corrective action or diagnostic routine in which several long post-delay times alternate with minimal charging rate or minimal charge voltage and pulse power electrode discharge cycles. In one or more embodiments, a corrective action or diagnostic routine can end based on communication from the pulse power controller 130 (e.g. communication via the pre-delay time 620). From block 510 flow continues to block 512.

At block 512, the voltage line is charged at the charge rate to the charge voltage after the selected post-delay time. For example, the voltage line charging can be after the post-delay time 640 has passed after the previous cycle (i.e. the capacitive or other discharge via the electrodes 144). For example, with reference to the assembly 150 of FIG. 1 the generator 152 can apply voltage to the shared voltage line. Because the discharge to the electrodes 144 is a sharp impulse in the voltage curve, the discharge time 670 can be detected with reasonable certainty. The generator 152 controls the time at which charging begins, and therefore can measure the post-delay time 640. From block 512, flow continues to block 514 at the pulse power controller 130.

At block 514, the time bin corresponding to the post-delay time is determined. The post-delay time 640 between the pulse power electrode discharge and when the charging of the voltage line is detected is measured. For example, with reference to the assembly 150 of FIG. 1, the pulse power controller 130 measure the post-delay time 640 and identify to which bin it corresponds. Because the pulse power controller 130 controls the discharge but must detect the beginning of the charging cycle initiated by the generator 152, the pulse power controller 130 experiences uncertainty in measurement. Post-delay time bin sizes allow the pulse power controller 130 to read communications with greater confidence. For long bin times, such as those associated with a corrective or diagnostic window or those initiating shutdown, the pulse power controller 130 can determine that the post-delay time is longer than a maximum post-delay time 674 and begin reset or shutdown procedures without detecting a charging rate or charge voltage on the voltage line or from the generator 152. From block 514 flow continues to block 516.

At block 516, based on the determined time bin of the post-delay time, the communication is determined. For example, with reference to the assembly 150 of FIG. 1, the pulse power controller 130 can determine which communication has been sent. The pulse power controller 130 can determine the identity of the communication that can be sent from the generator 152, alternator 118, or other sub-assembly component. A communication can include a request for modification of the pulse power controller 130 operation, information about the drilling mud flow rate, a communication indication shutdown, etc. In cases where the pulse power controller 130 and the generator 152 are autonomous once deployed in the wellbore, one or more pre-programmed communications, including multi-bit communications, can be transmitted including answers to communications or queries sent from the pulse power controller 130 to the generator 152. In one or more embodiments, communications can be sent to the pulse power controller 130 that were received from one or more tool above the alternator 118 or outside the assembly 150. From block 516 flow continues to optional block 518.

At block 518, optionally, a corrective action or diagnostic routine is performed based on the determined communication of the time bin corresponding to the post-delay time 640. Any communication received in the current charge cycle, or upon any multi-cycle communications previously received and not yet completed are operated upon. For example, with reference to the assembly 150 of FIG. 1, the pulse power controller 130 can reset operate upon the received communication. In one or more embodiments, this can include resetting one or more switches of the switch bank 138. If the switches are malfunctioning or mistimed, the alternator 118 and the generator 152 may not be protected from the power load while the electrodes 144 discharge. If the switches are not discharging correctly, such as slowly rather than substantially instantaneously (i.e. less than 1 ms) or other faults are occurring, the switches can be reset. In one or more embodiments, the pulse power section 154 may enter a diagnostic sequence, either independently or in concert with the generator 152, in order to determine if the switches, the wellbore, a short or electrical failure, etc. is causing out of range electrical or power draw during pulse power drilling. One communication or post-delay time bin may correspond to a diagnostic sequence and a reset, or the generator 152 can request these actions separately using different post-delay time bins. The pulse power controller 130 can also performs its primary function (i.e. discharging), while interpreting and implementing any communications from the generator 152. If the generator 152 is charging the voltage line, the pulse power controller 130 discharges the pulse power electrodes at the maximum pre-delay time 632, in order to protect the assembly 150. If the generator 152 does not charge the voltage line, the pulse power controller 130 can assume that shut down—either temporary or permanent—has been initiated. From block 518 flow continues to block 520.

At block 520, it is determined if the communication indicates a shutdown procedure. If a shutdown procedure has been initiated, the assembly 150 (i.e. both the pulse power controller 130 and the generator 152) can determine a shutdown is required. For example, with reference to the assembly 150 of FIG. 1, the pulse power controller 130, generator 152, alternator 118, etc. or any other part of the assembly 150 can determine that as shutdown is initiated, has occurred, or is occurring. If a shutdown has not been initiated, drilling continues and the pulse power controller 130 discharges the electrodes 144 and flow continues to the next charge cycle at block 502. If a shutdown has been initiated, a switch to the generator 152 can be closed or switches to both the generator 152 and the drilling fluid can be opened in order to ground the assembly 150 and prevent erroneous capacitive charging. If shutdown is initiated, the flow terminates once the generator 152 and pulse power controller 130 determine that no more cycles are currently occurring.

Figure 7:
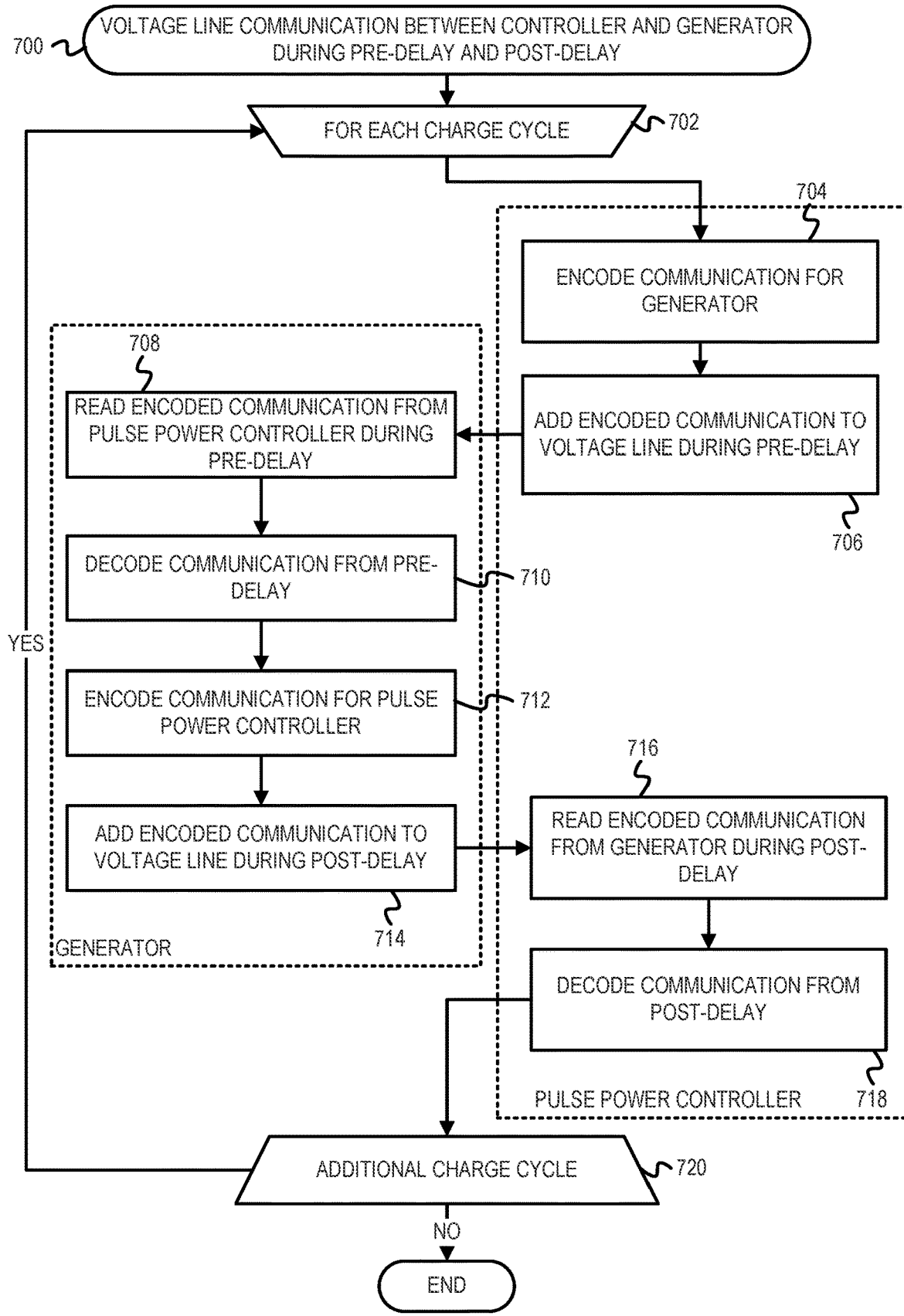
FIG. 7 depicts a flowchart of example operations for voltage line communications between a pulse power controller and a generator using additive signals during pre-delay and post-delay time periods, according to some embodiments.

Alternatively or in addition to the example operations for voltage line communications described in reference to FIGS. 2 and 5, there can be voltage line communications using additive signals. To illustrate, FIG. 7 depicts a flowchart of example operations for voltage line communications between a pulse power controller and a generator using additive signals during pre-delay and post-delay time periods, according to some embodiments. A flowchart 700 of FIG. 7 includes operations described as performed by the generator and the pulse power controller for consistency with the earlier description. Such operations can be performed by hardware, firmware, software, or a combination thereof. However, assembly component naming, division, and sub-section organization, and program code naming, organization, and deployment can vary due to arbitrary operator choice, assembly ordering, programmer choice, programming language(s), platform, etc. Additionally, operations of the flowchart 700 are described in reference to the example drilling apparatus of FIG. 1. The flowchart 700 includes the operations of blocks 708, 710, 712, and 714 as performed by the generator 152, and the operations of block 704, 706, 716, and 718 as performed by the pulse power controller 130. One or more of the operations described as being performed by the generator 152 may be instead performed by the alternator 118, a controller of the generator 152, or a processor of the generator 152. One or more of the operations described as being performed by the pulse power controller 130 may instead be performed by a processor of the pulse power controller 130, or performed in concert with one or more switches of the pulse power controller 130.

FIG. 7 includes operations related to communication between components of the assembly 150 via the voltage line that transfers voltage and current over a field joint (or any other type of joint or junction). While the generator 152 controls the voltage charging cycle, the pulse power controller 130 controls the voltage discharge. By adding signals to various parts of the charge and discharge cycle, the generator 152 and pulse power controller 130 can communicate data over the voltage connection while also continuing to drill with the electrodes 144.

At block 702, a charge cycle is initiated. For example, with reference to the assembly 150 of FIG. 1, a charge cycle can be initiated for the generator 152 and the pulse power controller 130. The generator 152 and the pulse power controller 130 can have independent clocks or clocks that are synched to one or more events of the charge cycle. Therefore, the start of the charge cycle—which is based on the end of the previous charge cycle or the beginning of charging of the voltage line—can be measured as beginning at different times in the generator 152 and the pulse power controller 130. For a first charge cycle or a charge cycle for which previous cycle data is not available, the charge cycle beginning can be determined by the generator 152, which initiates a first charging of the voltage line based on electrical charging via the alternator 118 by the turbine 116 which is controlled by drilling mud flow. A time difference between the beginning of a given charge cycle as measured by the generator 152 and the pulse power controller 130 is a result of separate clocks and can further be confounded by measurement accuracy. Block 702 begins a loop for each charge cycle that continues for the pulse power controller 130 at block 704 and starts at the generator 152 when flow reaches block 708. The beginning of the charge cycle is arbitrary and can be measured from the discharge time, from the beginning of the charging time, etc. as long as the pulse power controller 130 and the generator 152 recognize the same staring event.

At block 704, communication for the generator is encoded. A message or communication is encoded in an analog or digital signal at the pulse power controller 130. For example, with reference to the assembly 150 of FIG. 1, the pulse power controller 130 can select and encode the communication. The communication can be encoded using any suitable encoding scheme, including frequency modulation, amplitude modulation, Manchester shift, etc. The communication can be one or more bits in length. The communication can correspond to a command, request, or pre-selected set of communications agreed upon by the pulse power controller 130 and the generator 152. The set of communications that can be sent from the pulse power controller 130 to the generator 152 may be the same or different from the set of communications that can be sent from the generator 152 to the pulse power controller 130. The communication can also contain data about one or more drilling parameter to be transferred between components of the assembly 150 or to be stored as data in a component of the assembly 150. The communication can include any communication previously described in reference to FIGS. 2 and 5.

Figure 8:
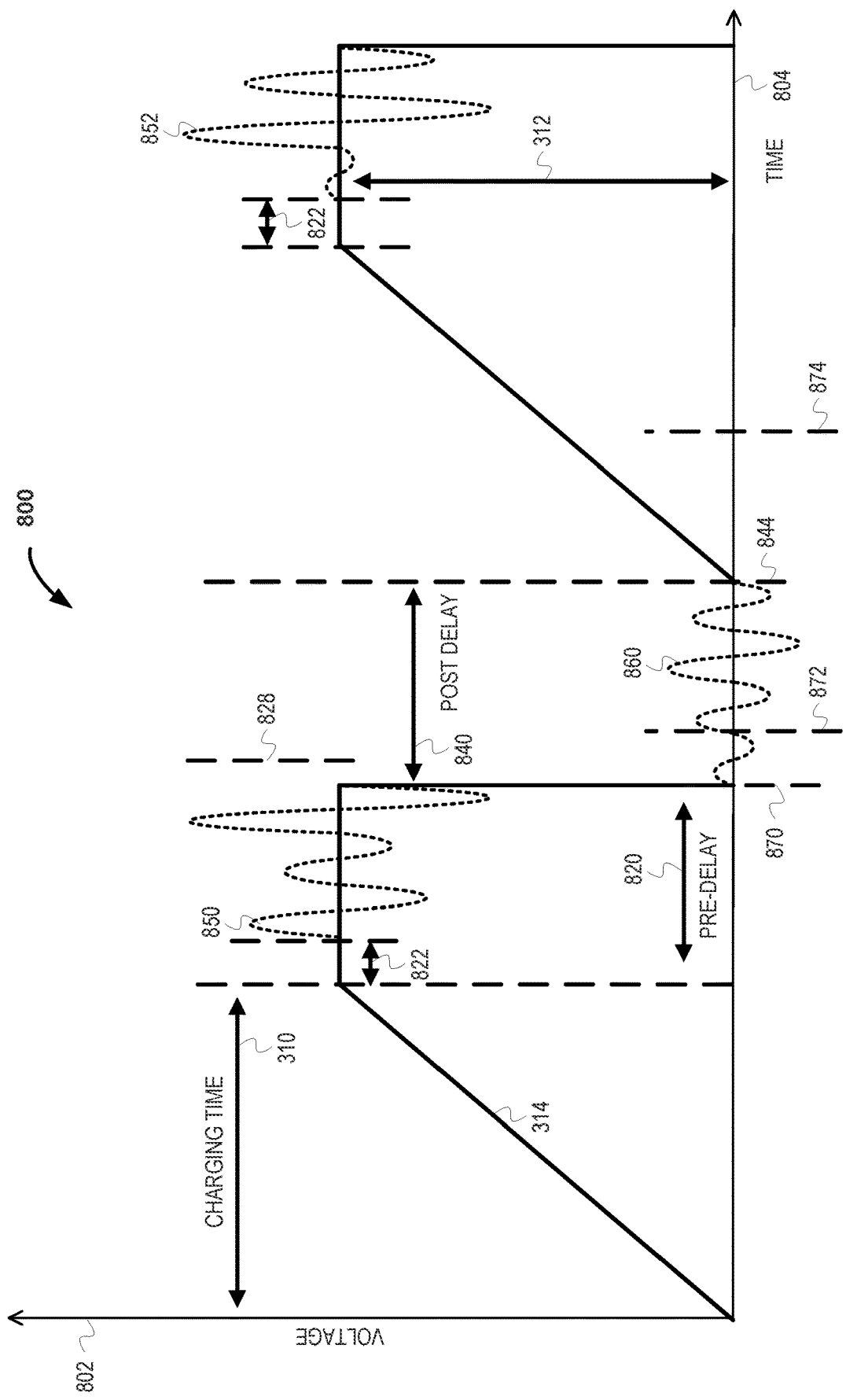
FIG. 8 depicts a graph of voltage over time for an example communication in which a communication signal is embedded within the DC signal during the pre-delay or post-delay, according to some embodiments.

To illustrate, FIG. 8 depicts a graph of voltage over time for an example communication in which a communication signal is embedded within the DC signal during the pre-delay or post-delay, according to some embodiments. FIG. 8 depicts a graph 800 displaying an example plot of voltage (on a y-axis 802) of the voltage line as a function of time (on an x-axis 804). Operations of FIG. 8 are described in reference to the example drilling apparatus 100 of FIG. 1. The charging time 310 is when the generator 152 applies increasing voltage on the voltage line connecting the generator 152 and the pulse power controller 130, while the charging rate 314 is the slope of the voltage curve during the charging time 310 to the charge voltage 312. A minimum pre-delay time 822 and a maximum pre-delay time 828 are shown, along with a discharge time 870 when the pulse power controller 130 discharges the voltage through the electrodes 144. A pre-delay time 820 corresponds to the measured time difference between the discharge time 870 and the end of the charging time 310. A minimum post-delay time 872 and a maximum post-delay time 874 are also shown. A post-delay time 840 corresponds to the measured time difference between the discharge time 870 and the beginning of the second cycle at time 844.

During each of the portions of the charging cycle for which voltage is constant (i.e. for the pre-delay time 820 and the post-delay time 840), an information signal can be added to or transmitted on top of the voltage. In FIG. 8, voltage is not shown to scale so that the information signal can be identified at both the highest voltage of the cycle (which can be approximately 16 kV) and at the lowest voltage of the cycle (which can be approximately 0 V). For the first cycle, an analog signal 850 is shown during the pre-delay time 820. The analog signal is shown as beginning after the minimum pre-delay time 822, where an offset from the end of the charging time 310 prevents the beginning of the analog signal 850 from being overwritten by the change in voltage during the charging time 310. An analog signal 860 is shown during the post-delay time 840. The analog signal 860 is shown as beginning at the discharge time 870, but can also begin after a minimum post-delay detection time (where the minimum post-delay time detection time may or may not be the same as the minimum post-delay time 872). For a second cycle, an analog signal 852 is also shown during the pre-delay time. In some embodiments, the added signals can be analog or digital or a combination thereof. Frequency, time, and voltage are not shown to scale.

Returning to FIG. 7 at block 706, the encoded communication is added to the voltage line during the pre-delay. The encoded message or communication can be added to the signal (as an information signal) on the voltage line during the pre-delay time 820. For example, with reference to the assembly 150 of FIG. 1, the pulse power controller 130 can add the encoded communication to the voltage line signal. During the pre-delay time 820 voltage is at a maximum or otherwise elevated level. Adding an information signal, such as analog signal 850, to a voltage which can be approximately 16 kV can require complex electronics. In one or more embodiments, an information signal can be combined with the charge voltage though multiplexing or other electronic combination. In one or more embodiments, an information signal can be embedded in the charge voltage 312. In one or more embodiments, an information signal can be directly encoded in the charge voltage 312 or encoded in the current drawn at the charge voltage 312. Any appropriate method for adding the information signal to the pre-delay time 820 can be used.

At block 708, the encoded communication in the pre-delay from the pulse power controller 130 is read. The encoded message or communication is detected and read during the pre-delay time 820. For example, with reference to the assembly 150 of FIG. 1, the generator 152 can read the encoded communication. The information is read from oscillations in the charge voltage 312 during the pre-delay time 820. The generator 152 can determine when the charge voltage 312 is reached, and therefore it can contain circuitry that can measure changes in the charge voltage 312 or absolute value of the charge voltage 312.

At block 710, the communication encoded in the pre-delay is decoded. The communication or information can be decoded or extracted from the information signal. For example, with reference to the assembly 150 of FIG. 1, the generator 152 can decode the communication. The communication or information can then be stored or acted upon, based on the communication or information that has been decoded and the pre-programmed responses of the generator 152 to such data. In one or more embodiment, a communication from the pulse power controller 130 can be stored as data by the generator 152 or forwarded to one or more sub-components of the generator 152 or transmitted to components of the assembly 150 above the generator 152, such as the alternator 188, the turbine 116, the logging tools 148, etc. In one or more embodiment, the communication can cause the generator 152 to alter one or more charge parameter for a subsequent cycle, as described in reference to FIG. 2.

At block 712, a communication for the pulse power controller is encoded. A message or communication is encoded in an analog or digital signal at the generator 152. For example, with reference to the assembly 150 of FIG. 1, the generator 152 can select and encode the communication to be sent to the pulse power controller 130. The communication can be encoded using any suitable encoding scheme, including frequency modulation, amplitude modulation, Manchester shift, etc. The communication can be one or more bits in length. The method of encoding at the generator 152 may be different that the communication of encoding used at the pulse power controller 130. The communication can correspond to a command, request, or pre-selected set of communications agreed upon by the pulse power controller 130 and the generator 152. The communication can also contain data about one or more power parameter to be transferred between components of the assembly 150 or to be stored as data in the pulse power controller 130. The communication can include any communication previously described in reference to FIGS. 2 and 5.

At block 714, the encoded communication is added to the voltage line during the post-delay. The encoded message or communication can be added to the signal on the voltage line (as an information signal) during the post-delay time 840. For example, with reference to the assembly 150 of FIG. 1, the generator 152 can add the encoded communication to the voltage line signal. During the post-delay time 840 voltage is at a minimum or approximately zero. Adding an information signal, such as analog signal 860, can require complex or standard electronics. In one or more embodiments, an information signal added multiplexing or other electronic combination. Any appropriate method for adding the information signal to the post-delay time 840 can be used.

At block 716, the encoded communication from the generator is read during the post-delay. The encoded communication or message is detected and read during the post-delay time 840. For example, with reference to the assembly 150 of FIG. 1, the pulse power controller 130 can read the detected encoded communication. The information is read from oscillations in the voltage or current during the post-delay time 840. The pulse power controller 130 can contain circuitry that can measure changes in the voltage or absolute value of the charge voltage, which can detect the encoded communication or information signal as well as detect the end of the charging time 310.

At block 718, the communication is decoded from the post-delay. The message or communication can be decoded or extracted from the information signal. For example, with reference to the assembly 150 of FIG. 1, the pulse power controller 130 can decode the communication from the post-delay time 840. The communication or information can then be stored or acted upon, based on the communication or information that has been decoded and the pre-programmed responses of the pulse power controller 130 to such data. In one or more embodiment, a communication from the generator 152 can be stored as data by the pulse power controller 130. In one or more embodiment, the communication can cause the pulse power controller 130 to alter one or more charge parameter for a subsequent cycle or setting for one or more capacitors or switches, as described in reference to FIG. 2.

At block 720, the determination is made if there is to be an additional charge cycle. For example, with reference to the assembly 150 of FIG. 1, the generator 152 or the pulse power controller 130 can determine if an additional charge cycle is warranted. If the communication decoded at the generator 152 in block 710 is a command for shutdown, either emergency or standard procedure, then no additional charge cycle is requested. In one or more embodiments, the pulse power controller 130 can request a shut down in a communication sent to the generator 152 or a shutdown procedure can require two or more charge cycles. If the communication decoded at the pulse power controller 130 at block 718 initiates a shutdown, one or more charge cycles may also be required. If additional charge cycles are required or requested flow can continues to block 702 for another charge cycle. If no additional charge cycles are requested, the flow ends.

FIGS. 2, 5, and 7 are annotated with a series of numbers. These numbers represent stages of operations. Although these stages are ordered for this example, the stages illustrate one example to aid in understanding this disclosure and should not be used to limit the claims. Subject matter falling within the scope of the claims can vary with respect to the order and some of the operations.

The flowcharts are provided to aid in understanding the illustrations and are not to be used to limit scope of the claims. The flowcharts depict example operations that can vary within the scope of the claims. Additional operations may be performed; fewer operations may be performed; the operations may be performed in parallel; and the operations may be performed in a different order. For example, the operations depicted in blocks 506 and 510 can be performed in parallel or concurrently. With respect to FIG. 5, an additional post-delay time is not necessary. It will be understood that each block of the flowchart illustrations and/or block diagrams, and combinations of blocks in the flowchart illustrations and/or block diagrams, can be implemented by program code. The program code may be provided to a processor of a general-purpose computer, special purpose computer, or other programmable machine or apparatus.

As will be appreciated, aspects of the disclosure may be embodied as a system, method or program code/instructions stored in one or more machine-readable media. Accordingly, aspects may take the form of hardware, software (including firmware, resident software, micro-code, etc.), or a combination of software and hardware aspects that may all generally be referred to herein as a "circuit," "module" or "system." The functionality presented as individual modules/units in the example illustrations can be organized differently in accordance with any one of platform (operating system and/or hardware), application ecosystem, interfaces, programmer preferences, programming language, administrator preferences, etc.

Any combination of one or more machine readable medium(s) may be utilized. The machine-readable medium may be a machine-readable signal medium or a machine-readable storage medium. A machine readable storage medium may be, for example, but not limited to, a system, apparatus, or device, that employs any one of or combination of electronic, magnetic, optical, electromagnetic, infrared, or semiconductor technology to store program code. More specific examples (a non-exhaustive list) of the machine readable storage medium would include the following: a portable computer diskette, a hard disk, a random access memory (RAM), a read-only memory (ROM), an erasable programmable read-only memory (EPROM or Flash memory), a portable compact disc read-only memory (CD-ROM), an optical storage device, a magnetic storage device, or any suitable combination of the foregoing. In the context of this document, a machine-readable storage medium may be any tangible medium that can contain, or store a program for use by or in connection with an instruction execution system, apparatus, or device. A machine-readable storage medium is not a machine-readable signal medium.

A machine-readable signal medium may include a propagated data signal with machine readable program code embodied therein, for example, in baseband or as part of a carrier wave. Such a propagated signal may take any of a variety of forms, including, but not limited to, electromagnetic, optical, or any suitable combination thereof. A machine readable signal medium may be any machine readable medium that is not a machine readable storage medium and that can communicate, propagate, or transport a program for use by or in connection with an instruction execution system, apparatus, or device.

Program code embodied on a machine-readable medium may be transmitted using any appropriate medium, including but not limited to wireless, wireline, optical fiber cable, RF, etc., or any suitable combination of the foregoing.

The program code/instructions may also be stored in a machine readable medium that can direct a machine to function in a particular manner, such that the instructions stored in the machine readable medium produce an article of manufacture including instructions which implement the function/act specified in the flowchart and/or block diagram block or blocks.

Example Computer

Figure 9:
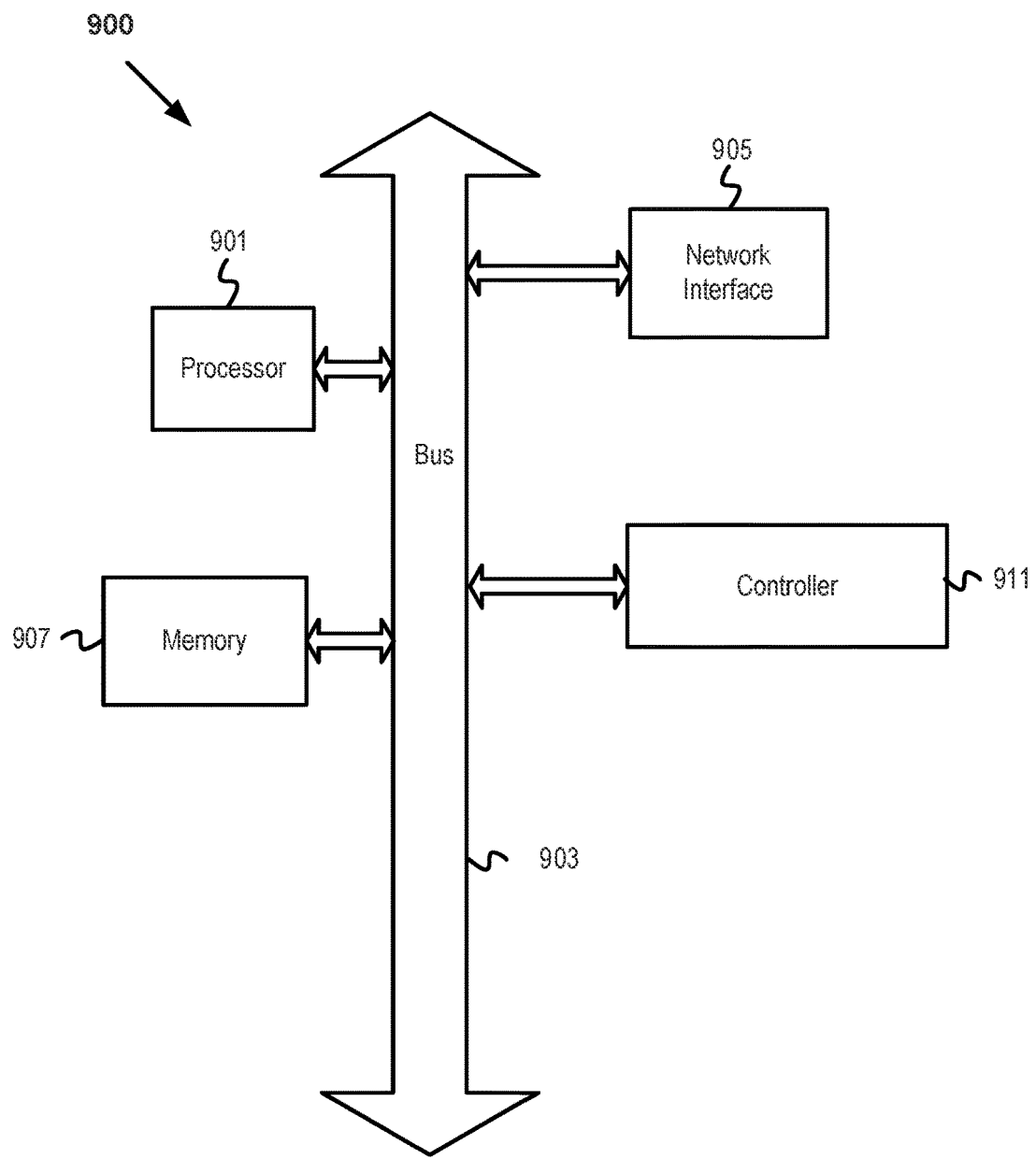
FIG. 9 depicts an example computer, according to some embodiments.

FIG. 9 depicts an example computer, according to some embodiments. A computer 900 of FIG. 9 can be representative of a computer or controller in the generator 152 or the pulse power section 154 of FIG. 1. The computer 900 of FIG. 9 can also be representative of a computer or controller of the pulse power controller 130, which is included in the pulse power section 154.

FIG. 9 depicts an example computer with a controller. The computer 900 includes a processor 901 (possibly including multiple processors, multiple cores, multiple nodes, and/or implementing multi-threading, etc.). The computer 900 includes a memory 907. The memory 907 may be system memory or any one or more of the above already described possible realizations of machine-readable media. The computer 900 also includes a bus 903 and a network interface 905. The computer 900 also includes a controller 911. The controller 911 may be the controller of either the generator 152 or the pulse power controller 130. Any one of the previously described functionalities may be partially (or entirely) implemented in hardware and/or on the processor 901. For example, the functionality may be implemented with an application specific integrated circuit, in logic implemented in the processor 901, in a co-processor on a peripheral device or card, etc. Further, realizations may include fewer or additional components not illustrated in FIG. 9 (e.g., video cards, audio cards, additional network interfaces, peripheral devices, etc.). The processor 901 and the network interface 905 are coupled to the bus 903. Although illustrated as being coupled to the bus 903, the memory 907 may be coupled to the processor 901.

While the aspects of the disclosure are described with reference to various implementations and exploitations, it will be understood that these aspects are illustrative and that the scope of the claims is not limited to them. In general, techniques for voltage line communication as described herein may be implemented with facilities consistent with any hardware system or hardware systems. Many variations, modifications, additions, and improvements are possible.

Plural instances may be provided for components, operations or structures described herein as a single instance. Finally, boundaries between various components, operations and data stores are somewhat arbitrary, and particular operations are illustrated in the context of specific illustrative configurations. Other allocations of functionality are envisioned and may fall within the scope of the disclosure. In general, structures and functionality presented as separate components in the example configurations may be implemented as a combined structure or component. Similarly, structures and functionality presented as a single component may be implemented as separate components. These and other variations, modifications, additions, and improvements may fall within the scope of the disclosure.

Example Embodiments

As used herein, the term "or" is inclusive unless otherwise explicitly noted. Thus, the phrase "at least one of A, B, or C" is satisfied by any element from the set {A, B, C} or any combination thereof, including multiples of any element.

The invention claimed is:

1. A method comprising:
periodically performing a process of emitting an electrical discharge into a subsurface formation from a drilling assembly positioned in a borehole formed in the subsurface formation, wherein the process comprises,
charging, by a generator of the drilling assembly for a first charge cycle, a capacitive element of the drilling assembly based on application of a voltage to a voltage line;
detecting, by a pulse power controller of the drilling assembly, a drop in the voltage on the voltage line that is in response to emitting the electrical discharge from the capacitive element;
transmitting, by the pulse power controller, a communication via the voltage line after a time delay;
decoding, by the generator, the communication based on the time delay; and
modifying, by the generator, a parameter of the process based on the decoded communication.

2. The method of claim 1, wherein the process of emitting the electrical discharge into the subsurface formation comprises pulse power drilling.

3. The method of claim 1, wherein decoding the communication comprises:
determining, after a level of the voltage to the voltage line has exceeded a full charge threshold, a pre-delay time that is a time between after the level of the voltage has exceeded the full charge threshold and before the drop in the level of the voltage on the voltage line that is in response to emitting the electrical discharge; and
decoding the communication based on a value of the pre-delay time.

4. The method of claim 3, wherein modifying the parameter comprises:
adjusting the parameter by a first value based on the value of the pre-delay time being in a first range; and
adjusting the parameter by a second value based on the value of the pre-delay time being in a second range.

5. The method of claim 1, wherein modifying the parameter comprises modifying at least one of
a charge rate,
a charging time,
a level of the voltage,
a pre-delay time that is a time between after the level of the voltage has exceeded a full charge threshold and before the drop in the level of the voltage on the voltage line that is in response to emitting the electrical discharge, and
a post-delay time that is a time between after the drop in the level of the voltage on the voltage line that is in response to emitting the electrical discharge and a start of a next charge cycle.

6. The method of claim 1, wherein decoding the communication comprises:
determining a post-delay time that is a time between after the drop in a level of the voltage on the voltage line that is in response to emitting the electrical discharge and a start of a next charge cycle; and
decoding the communication based on a value of the post-delay time.

7. The method of claim 1, wherein decoding the communication comprises:
detecting a parameter of at least one of the voltage and a current of the voltage line that comprises at least one of an amplitude and a frequency; and
decoding the communication based on a value of the parameter.

8. The method of claim 1, wherein decoding the communication comprises:
detecting an encoded signal added to the voltage that comprises at least one of an analog signal and a digital signal; and
decoding the communication based on the encoded signal.

9. The method of claim 1, wherein modifying the parameter comprises modifying the parameter based on the communication and at least one more communication encoded in the voltage in at least one more charge cycle.

10. The method of claim 1, wherein the process of emitting the electrical discharge comprises:
charging, by the generator for a second charge cycle based on the modified parameter, the capacitive element based on the application of the voltage to the voltage line.

11. The method of claim 2, wherein the pulse power drilling comprises:
in response to determining that a drill bit of the drilling assembly is not in contact with a bottom of the borehole, encoding a subsequent communication in a subsequent charge cycle in the voltage on the voltage line, wherein the subsequent communication includes a command to reduce at least one of a charge rate of charging the capacitive element and a level of the voltage.

12. The method of claim 1, wherein the periodically process of emitting the electrical discharge comprises:
encoding, by the pulse power controller, the communication in the voltage on the voltage line by varying at least one of,
a pre-delay time that is a time between after a level of the voltage has exceeded a full charge threshold and before the drop in the level of the voltage on the voltage line that is in response to emitting the electrical discharge,
an encoded signal added to the voltage that comprises at least one of an analog signal and a digital signal, and
wherein the decoding of the communication comprises decoding of the communication by the generator.

13. The method of claim 12, wherein the process of emitting the electrical discharge comprises:
encoding, by the generator, a different communication in the voltage on the voltage line by varying at least one of,
a post-delay time that is a time between after the drop in the level of the voltage on the voltage line that is in response to emitting the electrical discharge and a start of a next charge cycle,
a charge rate,
a charging time, the level of the voltage, and
  an encoded signal added to the voltage that comprises at least one of an analog signal and a digital signal; and
decoding, by the pulse power controller, the different communication in the voltage on the voltage line.

14. A system comprising:
a pulse power drilling assembly configured to pulse power drill a borehole formed in a subsurface formation, wherein the pulse power drill assembly comprises,
  a capacitive element;
  a generator electrically coupled to the capacitive element through a voltage line, wherein the generator is to generate a voltage that is to be transmitted through the voltage line to charge the capacitive element for a first charge cycle;
  a drill bit having an electrode that is electrically coupled with the capacitive element;
  a pulse power controller to control the electrode to perform a process to emit of an electrical discharge from the electrode into the subsurface formation to pulse power drill the borehole;
  a processor; and
  a computer-readable medium having instructions stored thereon that are executable by the processor to cause the processor to,
    detect, by the pulse power controller, a drop in the voltage on the voltage line that is in response to emission of the electrical discharge;
    transmit, by the pulse power controller, a communication via the voltage line after a time delay;
    decode, by the generator, the communication based on the time delay; and
    modify, by the generator, a parameter of pulse power drilling of the borehole based on the decoded communication.

15. The system of claim 14, wherein the instructions that are executable by the processor to cause the processor to decode the communication comprise instructions that are executable by the processor to cause the processor to:
  determine, after a level of the voltage to the voltage line has exceeded a full charge threshold, a pre-delay time that is a time between after the level of the voltage has exceeded the full charge threshold and before the drop in the level of the voltage on the voltage line that is in response to the emission of the electrical discharge; and
  decode the communication based on a value of the pre-delay time.

16. The system of claim 15, wherein the instructions that are executable by the processor to cause the processor to modify the parameter comprise instructions that are executable by the processor to cause the processor to:
  adjust the parameter by a first value based on the value of the pre-delay time being in a first range; and
  adjust the parameter by a second value based on the value of the pre-delay time being in a second range.

17. The system of claim 14, wherein the instructions that are executable by the processor to cause the processor to modify the parameter comprise instructions that are executable by the processor to cause the processor to modify at least one of
  a charge rate,
  a charging time,
  a level of the voltage,
  a pre-delay time that is a time between after the level of the voltage has exceeded a full charge threshold and before the drop in the level of the voltage on the voltage line that is in response to the emission of the electrical discharge, and
  a post-delay time that is a time between after the drop in the level of the voltage on the voltage line that is in response to the emission of the electrical discharge and a start of a next charge cycle.

18. A non-transitory, computer-readable medium having instructions stored thereon that are executable by a computing device to:
  monitor a voltage on a voltage line that is electrically coupled to a generator of a drilling assembly and a capacitive element of the drilling assembly, wherein the generator is to charge the capacitive element based on application of the voltage to the voltage line, wherein the drilling assembly is to perform pulse power drilling of a borehole into a subsurface formation by a process to emit an electrical discharge into the subsurface formation based on power stored in the capacitive element;
  detect, by a pulse power controller of the drilling assembly, a drop in the voltage on the voltage line that is in response to an emission of the electrical discharge;
  transmit, by the pulse power controller, a communication via the voltage line after a time delay;
  decode, by the generator, the communication based on the time delay; and
  modify, by the generator, a parameter of the pulse power drilling based on the decoded communication.

19. The non-transitory, computer-readable medium of claim 18, wherein the instructions to decode the communication comprise instructions to:
  determine, after a level of the voltage to the voltage line has exceeded a full charge threshold, a pre-delay time that is a time between after the level of the voltage has exceeded the full charge threshold and before the drop in the level of the voltage on the voltage line that is in response to the emission of the electrical discharge; and
  decode the communication based on a value of the pre-delay time.

20. The non-transitory, computer-readable medium of claim 19, wherein the instructions to modify the parameter comprise instructions to:
  adjust the parameter by a first value based on the value of the pre-delay time being in a first range; and
  adjust the parameter by a second value based on the value of the pre-delay time being in a second range.

* * * * *